(12) United States Patent
Yamazaki et al.

(10) Patent No.: US 8,076,671 B2
(45) Date of Patent: Dec. 13, 2011

(54) LIGHT EMITTING ELEMENT AND LIGHT EMITTING DEVICE USING THE ELEMENT

(75) Inventors: Shunpei Yamazaki, Tokyo (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 12/705,355

(22) Filed: Feb. 12, 2010

(65) Prior Publication Data

US 2010/0140607 A1 Jun. 10, 2010

Related U.S. Application Data

(63) Continuation of application No. 11/596,614, filed as application No. PCT/JP2005/009284 on May 16, 2005, now Pat. No. 7,663,140.

(30) Foreign Application Priority Data

May 21, 2004 (JP) .................................. 2004-152619

(51) Int. Cl.
*H01L 51/00* (2006.01)
(52) U.S. Cl. ................. 257/40; 257/79; 257/88; 257/89; 257/E51.018; 257/E51.022
(58) Field of Classification Search .................... 257/40, 257/79, 88, 89, E51.018, E51.022
See application file for complete search history.

(56) References Cited

U.S. PATENT DOCUMENTS

| | | | |
|---|---|---|---|
| 5,837,391 A | 11/1998 | Utsugi | |
| 5,932,895 A * | 8/1999 | Shen et al. | ........................ 257/89 |
| 6,013,384 A | 1/2000 | Kido et al. | |
| 6,107,734 A | 8/2000 | Tanaka et al. | |

(Continued)

FOREIGN PATENT DOCUMENTS

CN 1438828 A 8/2003

(Continued)

OTHER PUBLICATIONS

Kido, J. et al, "Multilayer White Light-Emitting Organic Electroluminescent Device," Science, vol. 267, Mar. 3, 1995, pp. 1332-1334.

(Continued)

*Primary Examiner* — Victor A Mandala
(74) *Attorney, Agent, or Firm* — Husch Blackwell LLP

(57) ABSTRACT

An object of the present invention is to provide a high-efficiency white light emitting element having a spectrum in a wide wavelength range. Another object is to provide a white light emitting element in which chromaticity of white color is hard to change over time. Still another object is to provide a white light emitting element in which the shape of an emission spectrum does not tend to depend on current density. A first light emitting element 310 and a second light emitting element 320 are serially laminated over a substrate 300. The first light emitting element 310 has a light emitting layer 312 between a first anode 311 and a first cathode 313, and the second light emitting element 320 has a light emitting layer 322 between a second anode 321 and a second cathode 323. Here, the light emitting layer 312 shows a first emission spectrum 330 having peaks both in a blue to blue green wavelength range and in a yellow to orange wavelength range, and the light emitting layer 322 shows a second emission spectrum 340 having peaks both in a blue green to green wavelength range and in an orange to red wavelength range.

33 Claims, 8 Drawing Sheets

U.S. PATENT DOCUMENTS

| | | |
|---|---|---|
| 6,447,934 B1 | 9/2002 | Suzuki et al. |
| 6,759,145 B2 | 7/2004 | Lin et al. |
| 6,872,472 B2 | 3/2005 | Liao et al. |
| 6,936,961 B2 | 8/2005 | Liao et al. |
| 7,015,504 B2 * | 3/2006 | Lyons et al. ............ 257/40 |
| 7,199,521 B2 | 4/2007 | Ibe |
| 7,239,081 B2 | 7/2007 | Tsutsui |
| 7,291,969 B2 | 11/2007 | Tsutsui |
| 7,403,177 B2 | 7/2008 | Tanada et al. |
| 7,420,203 B2 | 9/2008 | Tsutsui et al. |
| 7,504,049 B2 | 3/2009 | Tsutsui et al. |
| 7,511,421 B2 | 3/2009 | Tsutsui et al. |
| 7,535,440 B2 | 5/2009 | Nishi et al. |
| 2001/0051207 A1 | 12/2001 | Yamagata et al. |
| 2003/0099860 A1 | 5/2003 | Lin et al. |
| 2003/0127967 A1 * | 7/2003 | Tsutsui et al. ............ 313/498 |
| 2003/0189401 A1 * | 10/2003 | Kido et al. ............ 313/504 |
| 2004/0183082 A1 | 9/2004 | Yamazaki |
| 2004/0202893 A1 * | 10/2004 | Abe ............ 428/690 |
| 2004/0227460 A1 | 11/2004 | Liao et al. |
| 2004/0263066 A1 | 12/2004 | Abe et al. |
| 2005/0029933 A1 | 2/2005 | Liao et al. |
| 2005/0134174 A1 | 6/2005 | Shiratori et al. |
| 2005/0156197 A1 | 7/2005 | Tsutsui et al. |
| 2006/0091797 A1 | 5/2006 | Tsutsui et al. |
| 2007/0182318 A1 | 8/2007 | Kumaki et al. |
| 2007/0211084 A1 | 9/2007 | Ohtani et al. |
| 2007/0222379 A1 | 9/2007 | Yamazaki et al. |

FOREIGN PATENT DOCUMENTS

| | | |
|---|---|---|
| EP | 1 154 498 A2 | 11/2001 |
| EP | 1 318 553 A2 | 6/2003 |
| EP | 1 339 112 A2 | 8/2003 |
| EP | 1 351 558 A1 | 10/2003 |
| EP | 1 478 025 A2 | 11/2004 |
| JP | 6-207170 | 7/1994 |
| JP | 10-270172 | 10/1998 |
| JP | 11-329748 | 11/1999 |
| JP | 2000-68057 | 3/2000 |
| JP | 2002-33191 | 1/2002 |
| JP | 2002-260859 | 9/2002 |
| JP | 2003-45676 | 2/2003 |
| JP | 2003-187978 | 7/2003 |
| JP | 2003-264085 | 9/2003 |
| JP | 2003-272860 | 9/2003 |
| JP | 2004-6165 | 1/2004 |
| JP | 2004-39617 | 2/2004 |
| JP | 2004-327431 | 11/2004 |
| JP | 2004-327432 | 11/2004 |
| JP | 2004-342614 | 12/2004 |
| JP | 2005-183213 | 7/2005 |

OTHER PUBLICATIONS

Kido, J. et al, "Single-layer White Light-Emitting Organic Electroluminescent Devices Based on Dye-Dispersed Poly(N-vinylcarbazole)," Appl. Phys. Lett., vol. 67, No. 16, Oct. 16, 1995, pp. 2281-2283.

Hosokawa, C. et al, "31.3: Organic EL Materials Based on Styryl and Amine Derivatives," SID 01 Digest, Society for Information Display, 2001 International Symposium Digest of Technical Papers, vol. XXXII, Jun. 5-7, 2001, pp. 522-525.

International Search Report re application No. PCT/JP2005/009284, dated Sep. 20, 2005.

Written Opinion of the International Searching Authority re application No. PCT/JP2005/009284, dated Sep. 20, 2005.

Hatwar, T.K. et al., "54.1: Novel Approach to Stabilize Blue OLEDS and Fabrication of High-Efficiency Tandem White OLEDS for Large-Area Display Applications," SID Digest '08: SID International Symposium Digest of Technical Papers, 2008, pp. 814-817.

Liao, L.-S. et al., "54.2: Tandem White OLEDS Combining Fluorescent and Phosphorescent Emission," SID Digest '08: SID International Symposium Digest of Technical Papers, 2008, pp. 818-821.

Kondakova, M.E. et al., "17.3: Highly Efficient Fluorescent/Phosphorescent OLED Devices Using Triplet Harvesting," SID Digest '08: SID International Symposium Digest of Technical Papers, 2008, pp. 219-222.

Office Action re Chinese application No. CN 200580016272.X, dated Jun. 6, 2008 (with English translation).

Kido, J. et al, "Multilayer White Light-Emitting Organic Electroluminescent Device," Science, vol. 267, Mar. 3, 1995, pp. 1332-1334, No. 5202.

Hosokawa, C. et al, "31.3: Organic EL Materials Based on Styryl and Amine Derivatives," SID 01 Digest, Society for Information Display, 2001 International Symposium Digest of Technical Papers, vol. XXXII, Jun. 5-7, 2001, pp. 522-525/ 1-4.

Hatwar, T.K. et al., "54.1: Novel Approach To Stabilize Blue OLEDS and Fabrication of High-Efficiency Tandem White OLEDS for Large-Area Display Applications," SID Digest '08: SID International Symposium Digest of Technical Papers, vol. 39, 2008, pp. 814-817.

Liao, L.-S. et al., "54.2: Tandem White OLEDS Combining Fluorescent and Phosphorescent Emission," SID Digest '08: SID International Symposium Digest of Technical Papers, vol. 39, 2008, pp. 818-821.

Kondakova, M.E. et al., "17.3: Highly Efficient Fluorescent/Phosphorescent OLED Devices Using Triplet Harvesting," SID Digest '08: SID International Symposium Digest of Technical Papers, vol. 39, 2008, pp. 219-222.

Office Action re Japanese application No. JP 2005-146487, dated May 17, 2011 (with English translation).

* cited by examiner

LIGHT EMITTING ELEMENT AND LIGHT EMITTING DEVICE USING THE ELEMENT

This application is a continuation of application Ser. No. 11/596,614 filed on Nov. 15, 2006 now U.S. Pat. No. 7,663,140, which claims priority under 35 USC 371 of PCT/JP2005/009284 filed May 16, 2005.

TECHNICAL FIELD

The present invention relates to a light emitting element which includes a light emitting organic or inorganic compound and emits light by applying current. In particular, the invention relates to a light emitting element which emits white light and a light emitting device using the light emitting element.

BACKGROUND ART

In recent years, a light emitting element using a light emitting organic compound has been actively researched and developed as a type of light emitting element. A typical light emitting element has a layer including a light emitting organic or inorganic compound (hereinafter referred to as a "light emitting layer") interposed between a pair of electrodes. An electron and a hole are injected and transported from the pair of electrodes to the light emitting layer by applying a voltage to the element. The light emitting organic or inorganic compound is excited by recombination of those carriers (an electron and a hole) and emits light in returning from the excited state to a ground state.

Note that an excited state of an organic compound includes a singlet excited state and a triplet excited state. Light emission in the case of the singlet excited state is referred to as fluorescence, and light emission in the case of the triplet excited state is referred to as phosphorescence.

A great advantage of such a light emitting element is that the light emitting element can be manufactured to be thin and lightweight, because it is formed of a thin film of approximately submicron to several microns in thickness. In addition, an extremely high response speed is another advantage, because time between carrier injection and light emission is microseconds or less. Further, relatively low power consumption is also another advantage, because sufficient light can be provided at a DC voltage of approximately several volts to several tens of volts. Due to these advantages, the above described light emitting element attracts attention as a next-generation flat panel display.

In such a light emitting element, a pair of electrodes and a light emitting layer are formed into films. Thus, surface emission can be easily provided by forming a large-sized element. This characteristic is hard to be provided by a light source such as an incandescent lamp or an LED (point source), or a fluorescent lamp (line source). Therefore, the above described light emitting element has a high utility value as a light source for illumination or the like.

In view of an application field thereof, it can be said that the development of a white light emitting element is one of important issues as for such a light emitting element as described above. This is because, if a white light emitting element having sufficient luminance, luminous efficiency, element life, and chromaticity is provided, a high-quality full color display can be manufactured by combining the white light emitting element with a color filter and application to a white light source for a backlight, illumination, or the like can also be expected.

Currently, not a light emitting element which emits white light having a peak in each of red, green, and blue (light's three primary colors) wavelength ranges but a light emitting element which emits white light in which complementary colors (for example, blue light emission and golden yellow light emission) are combined (hereinafter referred to as a "dual wavelength white light emitting element") is the mainstream of the white light emitting element (for example. Reference 1: Chishio Hosokawa et al., SID' 01 DIGEST, 31.3 (pp. 522-525)). In Reference 1, white light emission is achieved by laminating two light emitting layers each emitting a complementary color so as to be in contact with each other. Such a dual wavelength light emitting element has high luminous efficiency and can have relatively favorable element life. Initial luminance of 400 cd/m$^2$ and luminance half-life of 10000 hours are achieved in Reference 1.

The dual wavelength white light emitting element can provide favorable white color in the CIE chromaticity coordinate. However, its emission spectrum is not continuous and has only two peaks having a complementary color relationship. Thus, the dual wavelength white light emitting element is hard to provide broad and near-natural white light. When a spectrum of one of complementary colors increases or decreases depending on current density or lighting time, chromaticity tends to shift far away from white. Considering a full color display combined with a color filter, when a spectrum of one of complementary colors increases or decreases, transmission spectra of red, green, and blue color filters do not match with emission spectra of the element, and a desired color is hard to be provided.

On the other hand, not only the dual wavelength white light emitting element as described above but a white light emitting element with emission spectra having a peak in each of red, green, and blue wavelength ranges (hereinafter referred to as a "triple wavelength white light emitting element") has also been researched and developed (for example, Reference 2: J. Kido et al., Science, Vol. 267, pp. 1332-1334 (1995), and Reference 3: J. Kido et al., Applied Physics Letters, Vol. 67 (16), pp. 2281-2283 (1995)). Reference 2 shows a structure of laminating three red, green, and blue light emitting layers, and Reference 3 shows a structure of adding red, green; and blue light emitting materials to one light emitting layer.

However, the triplet wavelength white light emitting element is inferior to the dual wavelength white light emitting element in terms of luminous efficiency and element life, and needs to be significantly improved. It is known that such an element as described in Reference 2 often does not provide stable white light; for example, a spectrum changes depending on current density.

In addition, a white light emitting element is attempted to be obtained in a different perspective from References 1 to 3 (for example, Reference 4: Japanese Patent Laid-Open No. 2003-264085, and Reference 5: Japanese Patent Laid-Open No. 2003-272860). In References 4 and 5, high current efficiency (luminance obtained with respect to certain current density) is attempted to be obtained by laminating a plurality of light emitting elements in series and overlapping light emitted from each of the light emitting elements. It is also disclosed that the white light emitting element can be provided by laminating light emitting elements which emits different colors of light in series.

However, in the case of providing, for example, a triple wavelength white light emitting element by the methods disclosed in References 4 and 5, three elements need to be laminated in series. In other words, if a white light emitting element having a spectrum in a wide wavelength range (a white light emitting element in which many different colors of light emission are mixed) is to be manufactured, the number of light emitting elements to be laminated in series increases significantly, and drive voltage multiplies. Since a plurality of light emitting elements are laminated in series, the laminated light emitting elements increase in total thickness and become susceptible to optical interference. Therefore, it becomes difficult to finely tune an emission spectrum.

As described above, a conventional dual wavelength white light emitting element has high emission efficiency and favorable element life; however, it has a problem of not having a spectrum in a wide wavelength range. Accordingly, chromaticity of white light tends to change over time. A conventional triple wavelength white light emitting element has a problem in that a spectrum shape tends to depend on current density in addition to low emission efficiency and short element life. Further, if a white light emitting element having a spectrum in a wide wavelength range is to be provided by the methods disclosed in References 4 and 5, the number of light emitting elements to be laminated in series increases significantly, and drive voltage rises considerably. Therefore, the conventional methods are not practical.

DISCLOSURE OF INVENTION

It is an object of the present invention to provide a high-efficiency white light emitting element having a spectrum in a wide wavelength range. It is another object to provide a white light emitting element in which chromaticity of white color is hard to change over time. It is still another object to provide a white light emitting element in which the shape of an emission spectrum does not tend to depend on current density.

As a result of repetitious keen examination, the present inventors have found out that the objects can be achieved by serially laminating a light emitting element with an emission spectrum having two peaks like a dual wavelength white light emitting element and another light emitting element with an emission spectrum having a peak in a different position from those of the above light emitting element to obtain light emission in which the spectra of both light emitting elements are overlapped. At this time, the two elements to be laminated in series preferably each show an emission spectrum having two peaks.

One feature of the invention is a light emitting element comprising a first light emitting element having a first light emitting layer including a light emitting organic compound between a first anode and a first cathode and a second light emitting element having a second light emitting layer including a light emitting organic compound between a second anode and a second cathode, wherein the first light emitting element and the second light emitting element are laminated in series, the first cathode is in contact with the second anode, one of the first light emitting element and the second light emitting element shows a first emission spectrum having at least two peaks and the other shows a second emission spectrum having a peak in a different position from those of the two peaks.

At this time, the second emission spectrum preferably has at least two peaks.

Another feature of the invention is a light emitting element comprising a first light emitting element having a first light emitting layer including a light emitting organic compound between a first anode and a first cathode and a second light emitting element having a second light emitting layer including a light emitting organic compound between a second anode and a second cathode, wherein the first light emitting element and the second light emitting element are laminated in series, the first cathode is in contact with the second anode, one of the first light emitting element and the second light emitting element shows a first emission color including two kinds of emission colors having a complementary color relationship and the other shows a second emission color different from the two kinds of emission colors.

At this time, the second emission color preferably includes two kinds of emission colors having a complementary color relationship, and the two kinds of emission colors are preferably different from the two kinds of emission colors having a complementary color relationship of the first emission color. Note that a combination of a blue to blue green wavelength range and a yellow to orange wavelength range is preferable as the complementary color relationship. Thus, another feature of the invention is a light emitting element comprising a first light emitting element having a first light emitting layer including a light emitting organic compound between a first anode and a first cathode and a second light emitting element having a second light emitting layer including a light emitting organic compound between a second anode and a second cathode, wherein the first light emitting element and the second light emitting element are laminated in series, the first cathode is in contact with the second anode, one of the first light emitting element and the second light emitting element shows a first emission spectrum having peaks both in a blue to blue green wavelength range and in a yellow to orange wavelength range and the other shows a second emission spectrum having a peak in a different position from those of the first emission spectrum.

At this time, the second emission spectrum preferably has peaks both in a blue green to green wavelength range and in an orange to red wavelength range so as to have a different complementary color relationship from that of the first emission spectrum.

The emission spectrum having peaks both in a blue to blue green wavelength range and in a yellow to orange wavelength range preferably has peaks both in a wavelength range from 430 nm to 480 nm and in a wavelength range from 550 nm to 600 nm. Thus, another feature of the invention is a light emitting element comprising a first light emitting element having a first light emitting layer including a light emitting organic compound between a first anode and a first cathode and a second light emitting element having a second light emitting layer including a light emitting organic compound between a second anode and a second cathode, wherein the first light emitting element and the second light emitting element are laminated in series, the first cathode is in contact with the second anode, one of the first light emitting element and the second light emitting element shows a first emission spectrum having peaks both in a wavelength range from 430 nm to 480 nm and in a wavelength range from 550 nm to 600 nm and the other shows a second emission spectrum having a peak in a different position from those of the first emission spectrum.

At this time, the second emission spectrum preferably has peaks both in a wavelength range from 480 nm to 550 nm and in a wavelength range from 600 nm to 680 nm so as to have peaks both in a blue green to green wavelength range and in an orange to red wavelength range.

According to the above described structure of the invention, the first light emitting layer preferably has a third light emitting layer and a fourth light emitting layer which emits light of a different color from that of the third light emitting layer. At this time, a structure in which the third light emitting layer is formed in contact with the fourth light emitting layer is preferable because such a structure can be easily manufactured.

According to the above described structure of the invention, the second light emitting layer preferably has a fifth light emitting layer and a sixth light emitting layer which emits light of a different color from that of the fifth light emitting layer. At this time, a structure in which the fifth light emitting layer is formed in contact with the sixth light emitting layer is preferable because such a structure can be easily manufactured.

A high-efficiency light emitting device having a spectrum in a wide wavelength range, a light emitting device in which chromaticity is hard to change over time, and a light emitting device in which the shape of an emission spectrum does not tend to depend on current density can be provided by manufacturing a light emitting device using the light emitting element of the invention as described above. Therefore, the invention includes a light emitting device using the light emitting element of the invention. In particular, the light emitting element of the invention has a spectrum in a wide wavelength range. Thus, a light emitting device further including a color filter or a lighting device is preferable as the light emitting device.

Note that a light emitting device in this specification refers to a light emitting body, an image display device, and the like using a light emitting element. Further, the display device includes all of the following modules: a module having a light emitting element provided with a connector such as an FPC (Flexible Printed Circuit), a TAB (Tape Automated Bonding) tape, or a TCP (Tape Carrier Package); a module having a TAB tape or a TCP provided with a printed wiring board at the end thereof; and a module having an IC (Integrated Circuit) directly mounted on a light emitting element by a COG (Chip On Glass) method.

A high-efficiency white light emitting element having a spectrum in a wide wavelength range can be provided by carrying out the invention. A white light emitting element in which chromaticity of white color is hard to change over time can also be provided. Further, a white light emitting element in which the shape of an emission spectrum does not tend to depend on current density can be provided.

BEST MODE FOR CARRYING OUT THE INVENTION

Hereinafter, an embodiment mode of the present invention is described in detail with a basic structure, a principle of operation, and a specific structure example. Note that at least either one of electrodes of a light emitting element needs only to be transparent in order to extract light. Thus, not only a conventional element structure in which a transparent electrode is formed over a substrate and light is extracted from a substrate side but also a structure in which light is extracted from the opposite side of a substrate and a structure in which light is extracted from both sides of electrodes are actually applicable.

Figure 1A:
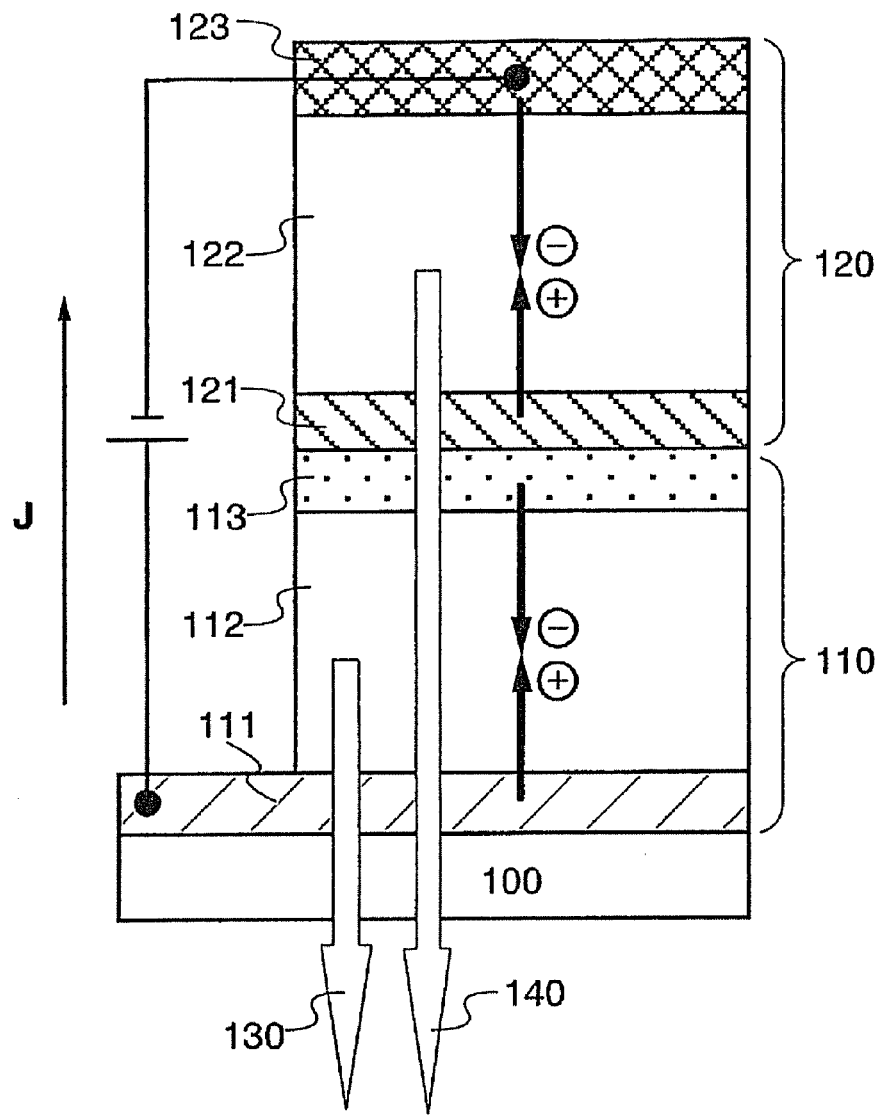
FIGS. 1A and 1B show a basic concept of a light emitting element of the present invention.

First, a basic structure of a light emitting element of the invention is described with reference to FIG. 1A. FIG. 1A shows a structure example of a light emitting element of the invention, in which a first light emitting element 110 and a second light emitting element 120 are laminated in series over a substrate 100. The first light emitting element 110 has a light emitting layer 112 between a first anode 111 and a first cathode 113, and the second light emitting element 120 has a light emitting layer 122 between a second anode 121 and a second cathode 123. Each of the light emitting layers 112 and 122 both include a light emitting organic compound.

When a positive bias is applied to the first anode 111 side and a negative bias is applied to the second cathode 123 side of the light emitting element, a current with certain current density J flows through the element. At this time, a hole is injected from the first anode 111 to the light emitting layer 112 of the first light emitting element and an electron is injected from the first cathode 113 to the light emitting layer 112 of the first light emitting element. When the hole and the electron are recombined, first light 130 can be provided from the first light emitting element 110. A hole is injected from the second anode 121 to the light emitting layer 122 of the second light emitting element and an electron is injected from the second cathode 123 to the light emitting layer 122 of the second light emitting element. When the hole and the electron are recombined, second light 140 can be provided from the second light emitting element 120. In other words, light can be provided from both the first light emitting element 110 and the second light emitting element 120.

Figure 1B:
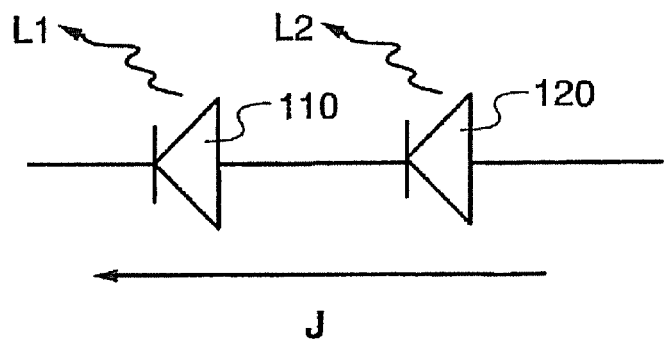

Note that the circuit of light emitting elements is as shown in FIG. 1B. Current with common current density flows through the first light emitting element 110 and the second light emitting element 120, which each emit light at luminance corresponding to the current density J (in FIG. 1B, L1 and L2). At this time, in the example shown in FIG. 1A, both the first light 130 and the second light 140 can be extracted when the first anode 111, the first cathode 113, and the second anode 121 have light-transmitting properties.

In the invention, either one of the first light 130 and the second light 140 shows a first emission spectrum having at least two peaks. The other shows a second emission spectrum having a peak in a different position from those of the first emission spectrum. For example, the first light 130 shows a first emission spectrum having peaks both in a blue to blue green wavelength range and in a yellow to orange wavelength range. The second light 140 shows a second emission spectrum having a peak in an orange to red wavelength range (details are described in the following Embodiment Mode 1). Note that a blue to blue green emission color and a yellow to orange emission color have a complementary color relationship.

It is relatively easy for a light emitting element which emits light by exciting a light emitting organic compound with current to provide light showing an emission spectrum having two peaks (the first emission spectrum in the above example), as typified by a dual wavelength white light emitting element of a conventional art. However, it is very difficult to provide an emission spectrum having three or more peaks or a broad emission spectrum. A technique for solving the technical problems is the structure of the invention. In other words, the structure is that, based on a light emitting element which shows an emission spectrum having two peaks (the first light emitting element in the above example) like a dual wavelength white light emitting element, a light emitting element having an emission spectrum in a range which cannot be complemented only with the above element is laminated in series and light is overlapped. With this structure, the number of elements to be laminated can be more reduced than if light emitting elements having only single peak are laminated in series. Accordingly, a rise in drive voltage can be suppressed. Therefore, the structure is effective. As shown in FIG. 1B, luminance which is the sum of luminance of L1 and luminance of L2 obtained with respect to certain current density J can be obtained in the light emitting element of the invention. Thus, high luminance with respect to current (in other words, current efficiency) can also be provided.

Figure 4A:
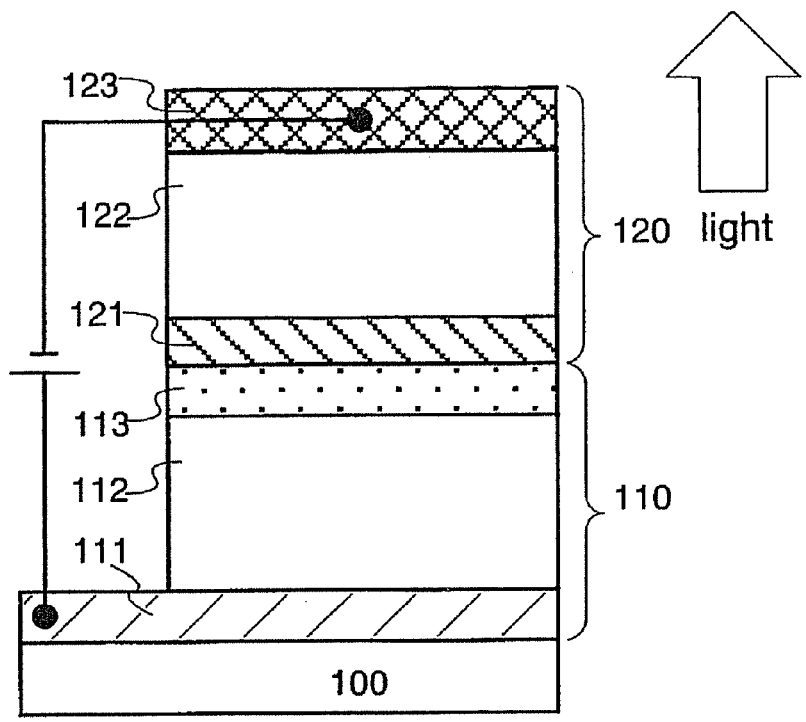
FIGS. 4A and 4B show structure examples of a light emitting element of the present invention.
Figure 4B:
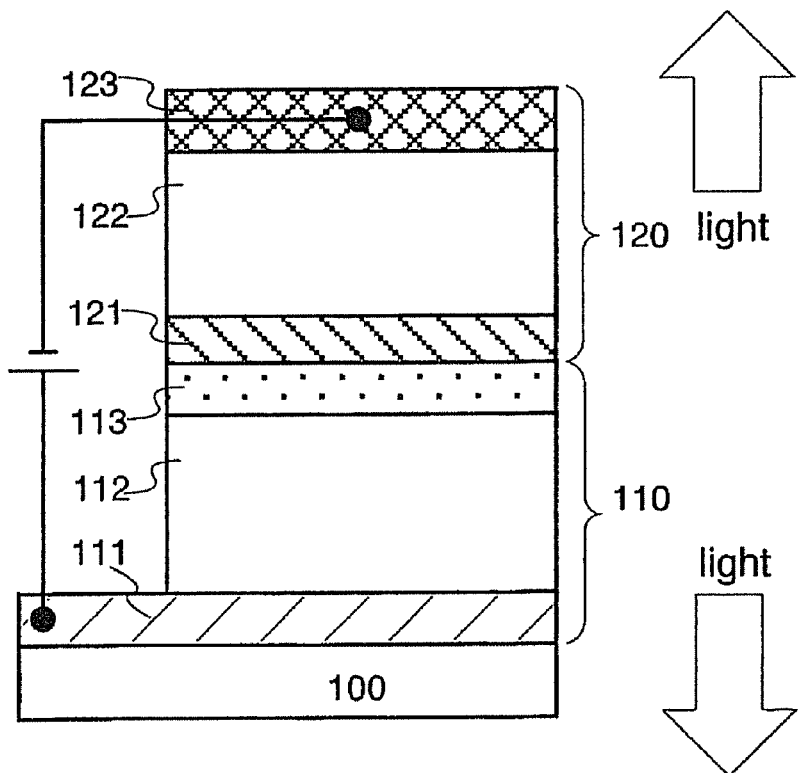

Note that above described is the case where the first light emitting element 110 shows the first emission spectrum having at least two peaks and the second light emitting element 120 shows the second emission spectrum having a peak in a different position from those of the first emission spectrum; however, the structure may be the reverse. In other words, the first light emitting element 110 may show the second emission spectrum and the second light emitting element 120 may show the first emission spectrum. Although FIG. 1A shows the structure in which the substrate 100 is provided for the first anode 111 side, the substrate 100 may be provided for the second cathode 123 side. Further, although FIG. 1A shows the structure in which light is extracted from the first anode 111 side, light may be extracted from the second cathode 123 side as shown in FIG. 4A or from both of them as shown in FIG. 4B.

Above described is the case where the light emitting layers 112 and 122 each include a light emitting organic compound, but the light emitting layers may each include a light emitting inorganic compound. In other words, the light emitting elements 110 and 120 may be inorganic light emitting devices (LEDs). One of the first light 130 and the second light 140 shows a first emission spectrum having at least two peaks, and the other shows a second emission spectrum having a peak in a different position from those of the first emission spectrum. For example, the first light 130 shows a first emission spectrum having peaks both in a blue to blue green wavelength range and in a yellow to orange wavelength range, and the second light 140 shows a second emission spectrum having a peak in an orange to red wavelength range. Note that emission colors corresponding to the two peaks of the first emission spectrum have a complementary color relationship. The second emission spectrum may also have peaks both in two wavelength ranges having a complementary color relationship. In that case, the second emission spectrum preferably has a peak in a different position from those of the first emission spectrum. In other words, two emission colors composing the first light are preferably different from two emission colors composing the second light.

A concept of the invention can be applied to not only a light emitting element which emits light with current as shown in FIGS. 1A and 1B but also a collisional excitation light emitting element like inorganic EL.

In other words, two collisional excitation light emitting elements are connected to each other in series. One of the two collisional excitation light emitting elements shows a first emission spectrum having at least two peaks, and the other shows a second emission spectrum having a peak in a different position from those of the first emission spectrum. Emission colors corresponding to the two peaks of the first emission spectrum have a complementary color relationship. The second emission spectrum may also have peaks both in two wavelength ranges having a complementary color relationship. In that case, the second emission spectrum preferably has peaks in different positions from those of the first emission spectrum. In other words, two emission colors of the light emitted from one of the two collisional excitation light emitting elements are preferably different from two emission colors of the light emitted from the other light emitting element.

The complementary color relationship is described using a blue to blue green wavelength range and a yellow to orange wavelength range as an example; however, another complementary color relationship (for example, a blue green to green wavelength range and an orange to red wavelength range) may be used. It is preferable to apply different complementary color relationships to the emission colors of the first light emitting element and the emission colors of the second light emitting element because very broad white light can be provided (details are described in the following Embodiment Mode 2).

According to the structure as described above, most part of a visible light range can be covered, and high-efficiency white light can be easily provided. Next, a structure example with consideration of a combination of emission colors is described hereinafter with an advantage over a conventional art.

Embodiment Mode 1

Figure 2A:
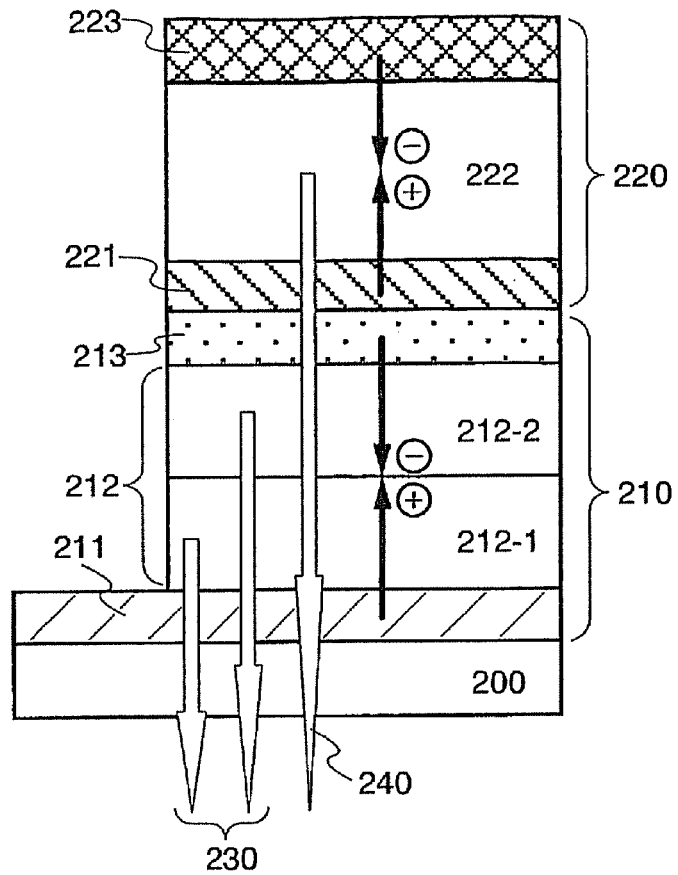
FIGS. 2A and 2B show a structure example of a light emitting element and the spectrum of light emitted from the light emitting element of the present invention.

An element structure is shown in FIG. 2A. FIG. 2A shows a structure example of a light emitting element of the invention, in which a first light emitting element 210 and a second light emitting element 220 are laminated in series over a substrate 200. The first light emitting element 210 has a light emitting layer 212 between a first anode 211 and a first cathode 213. The second light emitting element 220 has a light emitting layer 222 between a second anode 221 and a second cathode 223.

Here, the light emitting layer 212 of the first light emitting element includes a first light emitting layer 212-1 showing an emission spectrum having a peak in a blue to blue green wavelength range and a second light emitting layer 212-2 showing an emission spectrum having a peak in a yellow to orange wavelength range. The light emitting layer 222 of the second light emitting element shows an emission spectrum having a peak in an orange to red wavelength range. The order of lamination of the first light emitting layer 212-1 and the second light emitting layer 212-2 may be the reverse.

Figure 2B:
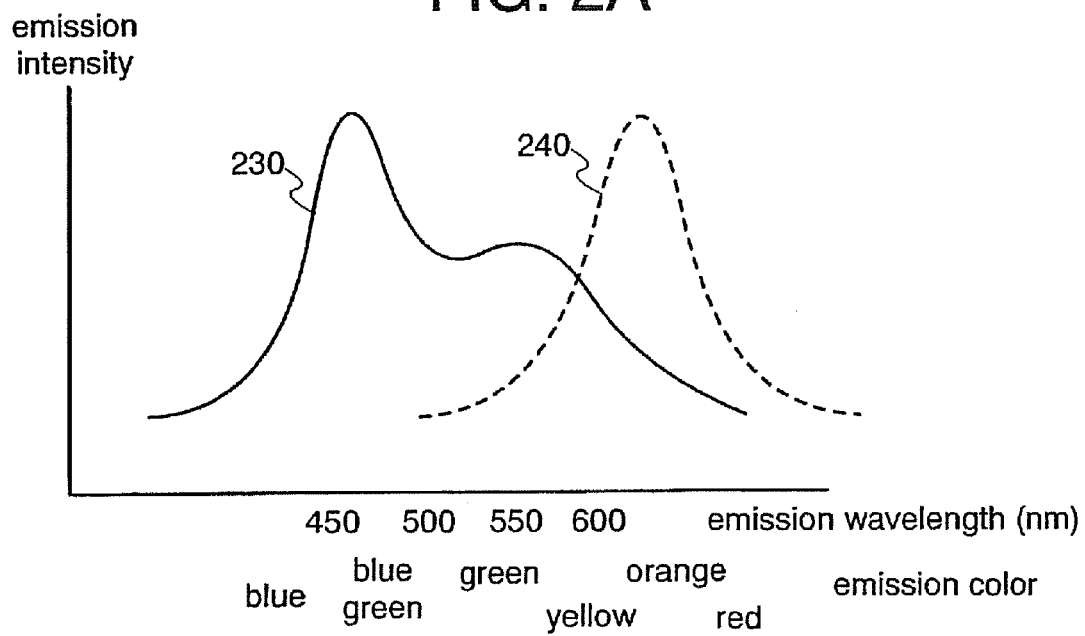

When a positive bias is applied to the first anode 211 side and a negative bias is applied to the second cathode 223 side of the light emitting element, first light 230 and second light 240 can be provided. The first light 230 is a combination of both light emitted from the first light emitting layer 212-1 and the second light emitting layer 212-2; thus, it shows an emission spectrum having peaks both in a blue to blue green wavelength range and in a yellow to orange wavelength range as shown in FIG. 2B. In other words, the first light emitting element shows dual wavelength white or near-white (bluish white, yellowish white, or the like) emission color. The second light 240 shows an emission spectrum having a peak in an orange to red wavelength range as shown in FIG. 2B.

Thus, the light emitting element of the invention according to Embodiment Mode 1 can provide light which covers a blue to blue green wavelength range, a yellow to orange wavelength range, and an orange to red wavelength range as a result of overlapping the first light 230 with the second light 240.

The first light emitting element 210 has a similar structure to that of a dual wavelength white light emitting element using a complementary color relationship which is often conventionally used, and can realize a white or near-white light emitting element having high luminance and favorable element life. However, the first light emitting element shows a poor spectrum in a red wavelength range, and is not suitable for a full color display using a color filter. It is understood that the structure as in Embodiment Mode 1 can sufficiently solve the problem.

Even when luminance of the first light emitting layer 212-1 (showing an emission spectrum having a peak in a blue to blue green wavelength range), for example, is deteriorated over time or changed depending on current density, contribution of the first light emitting layer 212-1 to the entire spectrum is approximately one third. Therefore, the structure has the advantage of a relatively small shift in chromaticity. In the case of a light emitting element which only includes the first light emitting element 210 like a conventional dual wavelength white light emitting element, luminance change of the first light emitting layer 212-1 greatly affects chromaticity.

A similar emission spectrum to that in Embodiment Mode 1 can be provided by serially laminating three light emitting elements a light emitting element which emits light in a blue to blue green wavelength range, a light emitting element which emits light in a yellow to orange wavelength range, and a light emitting element which emits light in an orange to red wavelength range. However, drive voltage in that case becomes approximately 1.5 times or more as much as that of the light emitting element of Embodiment Mode 1 in which two elements are laminated in series.

Above described as an example is the case where the first light emitting element 210 shows the first emission spectrum having two peaks because of having the two light emitting layers (212-1 and 212-2) and the second light emitting element 220 shows the second emission spectrum having a peak in a different position from those of the first emission spectrum. However, the second light emitting element 220 may show the first emission spectrum. In other words, the second light emitting element 220 may show the first emission spectrum having two peaks because of having the two light emitting layers, and the first light emitting element 210 may show the second emission spectrum having a peak in a different position from those of the first emission spectrum. Although FIG. 2A shows the structure in which the substrate 200 is provided for the first anode 211 side, the substrate may be provided for the second cathode 223 side. Further, although FIG. 2A shows the structure in which light is extracted from the first anode 211 side, light may be extracted from the second cathode 223 side or from both of them.

Embodiment Mode 2

Figure 3A:
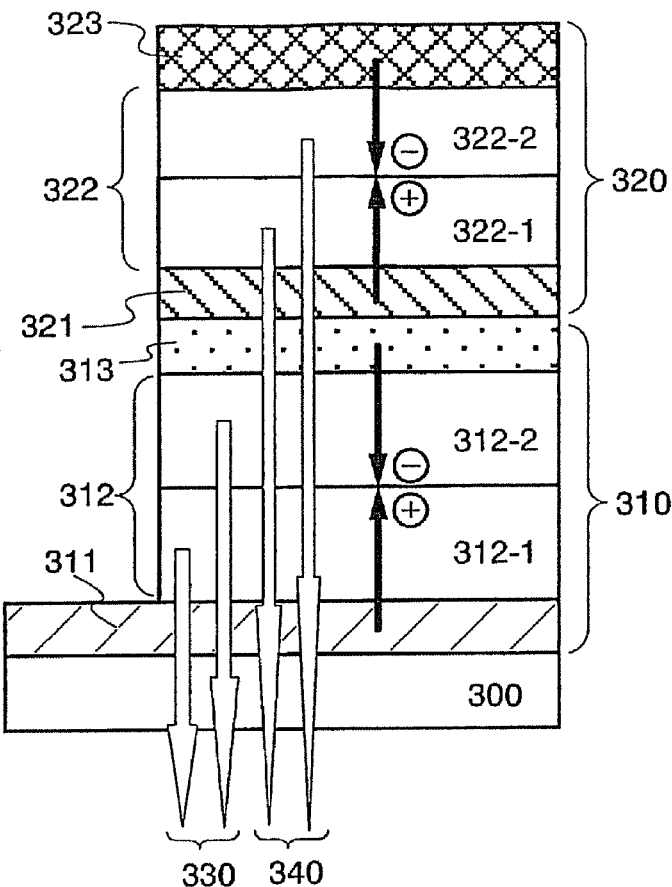
FIGS. 3A and 3B show a structure example of a light emitting element and the spectrum of light emitted from the light emitting element of the present invention.

An element structure is shown in FIG. 3A. FIG. 3A shows a structure example of a light emitting element of the invention, in which a first light emitting element 310 and a second light emitting element 320 are laminated in series over a substrate 300. The first light emitting element 310 has a light emitting The second light emitting element 320 has a light emitting layer 322 between a second anode 321 and a second cathode 323.

Here, the light emitting layer 312 of the first light emitting element includes a first light emitting layer 312-1 showing an emission spectrum having a peak in a blue to blue green wavelength range and a second light emitting layer 312-2 showing an emission spectrum having a peak in a yellow to orange wavelength range. The light emitting layer 322 of the second light emitting element includes a third light emitting layer 322-1 showing an emission spectrum having a peak in a blue green to green wavelength range and a fourth light emitting layer 322-2 showing an emission spectrum having a peak in an orange to red wavelength range. Note that the order of lamination of the first light emitting layer 312-1 and the second light emitting layer 312-2 may be the reverse. The order of lamination of the third light emitting layer 322-1 and the fourth light emitting layer 322-2 may be the reverse.

Figure 3B:
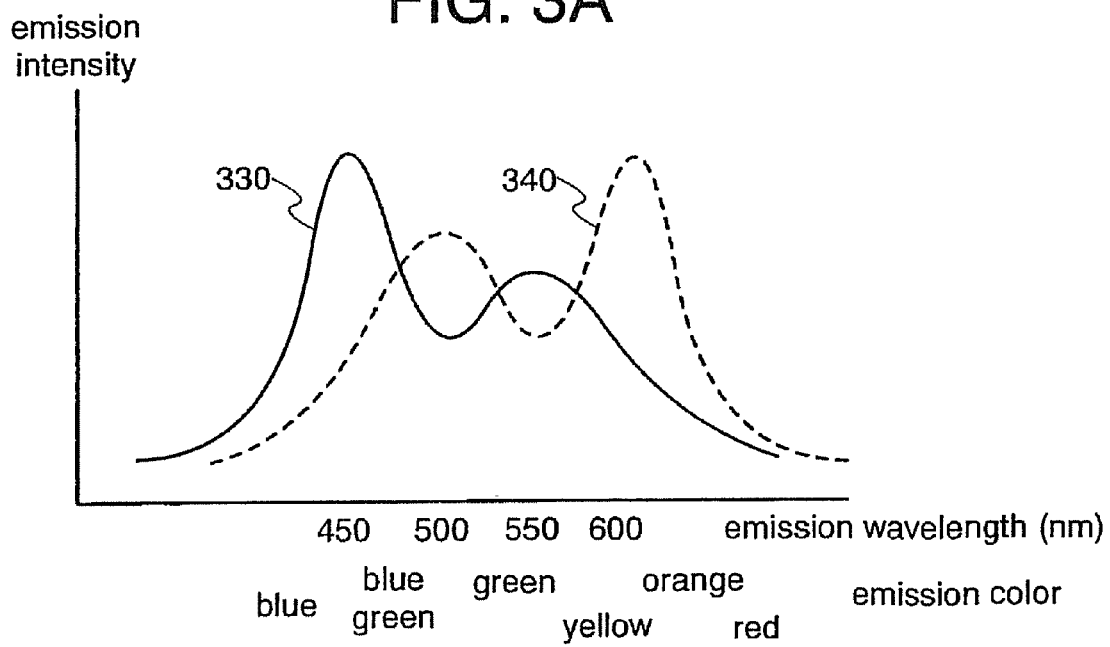

When a positive bias is applied to the first anode 311 side and a negative bias is applied to the second cathode 323 side of the light emitting element, first light 330 and second light 340 can be provided. The first light 330 is a combination of both light emitted from the first light emitting layer 312-1 and the second light emitting layer 312-2; thus, it shows an emission spectrum having peaks both in a blue to blue green wavelength range and in a yellow to orange wavelength range as shown in FIG. 3B. In other words, the first light 330 is dual wavelength white or near-white emission color. The second light 340 is a combination of both light emitted from the third light emitting layer 322-1 and the fourth light emitting layer 322-2; thus, it shows an emission spectrum having peaks both in a blue green to green wavelength range and in an orange to red wavelength range as shown in FIG. 3B. In other words, the second light emitting element 320 shows dual wavelength white or near-white emission color which is different from that of the first light emitting element 310.

Thus, the light emitting element of the invention according to Embodiment Mode 2 can provide light which covers a blue to blue green wavelength range, a blue green to green wavelength range, a yellow to orange wavelength range, and an orange to red wavelength range as a result of overlapping the first light 330 with the second light 340.

The first light emitting element 310 and the second light emitting element 320 each have a similar structure to that of a dual wavelength white light emitting element using a complementary color relationship which is often conventionally used, and can realize a white or near-white light emitting element having high luminance and favorable element life. However, the first light emitting element 310 shows a poor spectrum mainly in a blue green to green (specifically, emerald green) wavelength range and in an orange to red wavelength range, and is not suitable for a full color display using a color filter. In addition, the first light emitting element has a narrow spectrum in an emerald green wavelength range and lacks in vividness. However, it is understood that the structure according to Embodiment Mode 2 can complement the disadvantage with the emission spectrum of the laminated second light emitting element 320 and can sufficiently solve the problem.

Even when luminance of the first light emitting layer 312-1 (showing an emission spectrum having a peak in a blue to blue green wavelength range), for example, is deteriorated over time or changed depending on current density, contribution of the first light emitting layer 312-1 to the entire spectrum is approximately one fourth. Therefore, the structure has the advantage of a relatively small shift in chromaticity. In the case of a light emitting element which only includes the first light emitting element 310 like a conventional dual wavelength white light emitting element, luminance change of the first light emitting layer 312-1 greatly affects chromaticity.

A similar emission spectrum to that in Embodiment Mode 2 can be provided by serially laminating four light emitting elements: a light emitting element which emits light in a blue to blue green wavelength range, a light emitting element which emits light in a blue green to green wavelength range, a light emitting element which emits light in a yellow to orange wavelength range, and a light emitting element which emits light in an orange to red wavelength range. However, drive voltage in that case becomes approximately twice or more as much as that of the light emitting element of Embodiment Mode 2 in which two elements are laminated in series.

Above described as an example is the case where the first light emitting element 310 shows a spectrum having peaks both in a blue to blue green wavelength range and in a yellow to orange wavelength range and the second light emitting element 320 shows a spectrum having peaks both in a blue green to green wavelength range and in an orange to red wavelength range. However, they may be the reverse. In other words, the second light emitting element 320 may show a spectrum having peaks both in a blue to blue green wavelength range and in a yellow to orange wavelength range, and the first light emitting element 310 may show a spectrum having peaks both in a blue green to green wavelength range and in an orange to red wavelength range. Although FIG. 3A shows the structure in which the substrate 300 is provided the first anode 311 side, the substrate may be provided the second cathode 323 side. Further, although FIG. 3A shows the structure in which light is extracted from the first anode 311 side, light may be extracted from the second cathode 323 side or from both of them.

Embodiment Mode 3

Hereinafter described is a structure of a light emitting element of the invention, particularly, a material and an element structure which can be used for the first light emitting element 110 and the second light emitting element 120 in FIG. 1A. The light emitting element of the invention needs only to have at least the structure shown in FIG. 1A. However, a hole injection layer and/or a hole transport layer may be interposed between the first anode 111 and the light emitting layer 112 of the first light emitting element and between the second anode 121 and the light emitting layer 122 of the second light emitting element. An electron injection layer and/or an electron transport layer may be interposed between the first cathode 113 and the light emitting layer 112 of the first light emitting element and between the second cathode 123 and the light emitting layer 122 of the second light emitting element.

Note that the hole injection layer has a function of receiving a hole from an anode and the hole transport layer has a function of transferring a hole to a light emitting layer. The electron injection layer has a function of receiving an electron from a cathode and the electron transport layer has a function of transferring an electron to a light emitting layer.

Materials which can be used for each of the layers are specifically described as an example. However, a material which can be applied to the invention is not limited thereto.

As a hole injection material which can be used for the hole injection layer, a phthalocyanine-based compound is effective, and phthalocyanine (abbreviated to $H_2$-Pc), copper phthalocyanine (abbreviated to Cu-Pc), vanadyl phthalocyanine (abbreviated to VOPc), or the like can be used. Further, a chemically-doped conductive high molecular weight compound can be used, such as polyethylene dioxythiophene (abbreviated to PEDOT) doped with polystyrene sulfonate (abbreviated to PSS), polyaniline (abbreviated to PAni), or the like. A thin film of an inorganic semiconductor such as molybdenum oxide ($MoO_x$) vanadium oxide ($VO_x$), or nickel oxide ($NiO_x$), or an ultrathin film of an inorganic insulator such as aluminum oxide ($Al_2O_3$) is also effective. An aromatic amine-based compound can also be used, such as 4,4',4''-tris(N,N-diphenyl-amino)-triphenylamine (abbreviated to TDATA), 4,4',4''-tris[N-(3-methylphenyl)-N-phenyl-amino]-triphenylamine (abbreviated to MTDATA), N,N'-bis (3-methylphenyl)-N,N'-diphenyl-1,1'-biphenyl-4,4'-diamine (abbreviated to TPD), 4,4'-bis[N-(1-naphthyl)-N-phenyl-amino]-biphenyl (abbreviated to α-NPD), or 4,4'-bis[N-(4-(N,N-di-m-tolyl)amino)phenyl-N-phenylamino]biphenyl (abbreviated to DNTPD). Further, the aromatic amine-based compound may be doped with a material having acceptor properties thereto. Specifically, VOPc doped with 2,3,5,6-tetrafluoro-7,7,8,8-tetracyanoquinodimethane (abbreviated to $F_4$-TCNQ) which is an acceptor or α-NPD doped with $MoO_x$ which is an acceptor may be used.

As a hole transport material which can be used for the hole transport layer, an aromatic amine-based compound is preferable, and the above-described TDATA, MTDATA, TPD, α-NPD, DNTPD, or the like can be used.

As an electron transport material which can be used for the electron transport layer, a metal complex can be used, such as tris(8-quinolinolato)aluminum (abbreviated to $Alq_3$), tris(4-methyl-8-quinolinolato)aluminum (abbreviated to $Almq_3$) bis(10-hydroxybenzo[h]-quinolinato)beryllium (abbreviated to $BeBq_2$), bis(2-methyl-8-quinolinolato)(4-phenylphenolato)aluminum (abbreviated to BAlq), bis[2-(2-hydroxyphenyl)-benzoxazolate]zinc (abbreviated to $Zn(BOX)_2$), or bis [2-(2-hydroxyphenyl)benzothiazolate]zinc (abbreviated to $Zn(BTZ)_2$). An oxadiazole derivative such as 2-(4-biphenylyl)-5-(4-tert-butylphenyl)-1,3,4-oxadiazole (abbreviated to PBD) or 1,3-bis[5-(p-tert-butylphenyl)-1,3,4-oxadiazole-2-yl]benzene (abbreviated to OXD-7); a triazole derivative such as 3-(4-tert-butylphenyl)-4-phenyl-5-(4-biphenylyl)-1,2,4-triazole (abbreviated to TAZ) or 3-(4-tert-butylphenyl)-4-(4-ethylphenyl)-5-(4-biphenylyl)-1,2,4-triazole (abbreviated to p-EtTAZ); an imidazol derivative such as 2,2',2''-(1,3,5-benzenetriyl)tris[1-phenyl-1H-benzimidazole] (abbreviated to TPBI); or a phenanthroline derivative such as bathophenanthroline (abbreviated to BPhen) or bathocuproin (abbreviated to BCP) can be used in addition to the metal complex.

As an electron injection material which can be used for the electron injection layer, the above-described electron transport material such as $Alq_3$, $Almq_3$, $BeBq_2$, BAlq, $Zn(BOX)_2$, $Zn(BTZ)_2$, PBD, OXD-7, TAZ, p-EtTAZ, TPBI, BPhen, or BCP can be used. Alternatively, an ultrathin film of an insulating material, for example, alkali metal halide such as LiF or CsF, alkaline earth metal halide such as $CaF_2$, alkali metal oxide such as $Li_2O$, or the like is often used. In addition, an alkali metal complex such as lithium acetylacetonate (abbreviated to Li(acac)), 8-quinolinolato-lithium (abbreviated to Liq), or the like is also effective. The electron injection material may be doped with a material having donor properties thereto. Alkali metal, alkaline earth metal, rare earth metal, or the like can be used as a donor. Specifically, BCP doped with lithium which is a donor, $Alq_3$ doped with lithium which is a donor, or the like can be used.

Subsequently, a structure of the light emitting layer (112 or 122) of the first light emitting element 110 or the second light emitting element 120 is described. Here lists materials which can be used as a light emitting organic compound; however, materials are not limited thereto in the invention. Any light emitting organic compound may be used.

Blue to blue green light can be obtained by using perylene, 2,5,8,11-tetra-t-buthylperylene (abbreviated to TBP), 9,10-diphenylanthracene, or the like as a guest material and by dispersing the guest material into an appropriate host material. Alternatively, the light can be provided by a styryl arylene derivative such as 4,4'-bis(2,2-diphenylvinyl)biphenyl (abbreviated to DPVBi) or an anthracene derivative such as 9,10-di-2-naphthyl anthracene (abbreviated to DNA) or 9,10-bis(2-naphthyl)-2-t-butylanthracene (abbreviated to t-BuDNA). Alternatively, a polymer such as poly(9,9-dioctyl fluorene) may be used.

Blue green to green light can be provided by using coumarin-based pigment such as coumarin 30 or coumarin 6, bis[2-(2,4-difluorophenyl)pyridinato]picolinato iridium (abbreviated to FIrpic), bis(2-phenylpyridinato)acetylacetonato iridium (abbreviated to Ir(ppy)$_2$(acac)), or the like as a guest material and by dispersing the guest material into an appropriate host material. The light can be provided by dispersing the above-described perylene or TBP into an appropriate host material with a high concentration of 5 wt % or more. Alternatively, the light can be provided by a metal complex such as BAlq, Zn(BTZ)$_2$, bis(2-methyl-8-quinolinolato)chlorogallium (Ga(mq)$_2$Cl). A polymer such as poly(p-phenylenevinylene) may be used.

Yellow to orange light can be provided by using rubrene, 4-(dicyanomethylene)-2-[p-(dimethylamino)styryl]-6-methyl-4H-pyran (abbreviated to DCM1), 4-(dicyanomethylene)-2-methyl-6-(9-julolidyl)ethynyl-4H-pyran (abbreviated to DCM2), bis[2-(2-thienyl)pyridinato]acetylacetonato iridium (abbreviated to Ir(thp)$_2$(acac)), bis(2-phenyl quinolinato)acetylacetonato iridium (abbreviated to Ir(pq)$_2$(acac), or the like as a guest material and by dispersing the guest material into an appropriate host material. The light can also be provided by a metal complex such as bis(8-quinolinolato) zinc (abbreviated to Znq$_2$) or bis[2-cinnamoyl-8-quinolinolato]zinc (abbreviated to Znsq$_2$). A polymer such as poly(2, 5-dialkoxy-1,4-phenylenevinylene) may be used.

Orange to red light can be provided by using 4-(dicyanomethylene)-2,6-bis[p-(dimethylamino)styryl]-4H-pyran (abbreviated to BisDCM), 4-(dicyanomethylene)-2,6-bis[2-(julolidine-9-yl)ethynyl]-4H-pyran (abbreviated to DCM1), 4-(dicyanomethylene)-2-methyl-6-(9-julolidyl)ethynyl-4H-pyran (abbreviated to DCM2), bis[2-(2-thienyl)pyridinato] acetylacetonato iridium (abbreviated to Ir(thp)$_2$(acac)), or the like as a guest material and by dispersing the guest material into an appropriate host material. The light can also be provided by a metal complex such as bis(8-quinolinolato)zinc (abbreviated to Znq$_2$) or bis[2-cinnamoyl-8-quinolinolato] zinc (abbreviated to Znsq$_2$). A polymer such as poly(3-alkylthiophene) may be used.

Note that, in the above-described structure, an appropriate host material needs only to have an emission color of a shorter wavelength or a larger energy gap than that of a light emitting organic compound. Specifically, the appropriate host material can be selected from a hole transport material or an electron transport material typified by the above described example. Alternatively, 4,4'-bis(N-carbazolyl)biphenyl (abbreviated to CBP), 4,4',4''-tri(N-carbazolyl)triphenylamine (abbreviated to TCTA), 1,3,5-tris[4-(N-carbazolyl)phenyl]benzene (abbreviated to TCPB), or the like may be used.

As an anode (the first anode 111 and the second anode 121) material in the light emitting element of the invention, a conductive material having a high work function is preferably used. In the case of extracting light through the first anode 111, a transparent conductive material such as indium tin oxide (ITO), indium zinc oxide (IZO), zinc oxide (ZnO), or indium tin oxide doped with silicon oxide may be used for the first anode 111. In the case of making the first anode 111 side shield against light, a single-layer film of TiN, ZrN, Ti, W, Ni, Pt, Cr, or the like; a laminated layer of a titanium nitride film and a film containing aluminum as its main component; a three-layer structure of a titanium nitride film, a film containing aluminum as its main component, and another titanium nitride film; or the like can be used for the first anode 111. Alternatively, the first anode 111 may be formed by laminating the above described transparent conductive material over a reflective electrode of Ti, Al, or the like. The second anode 121 needs to transmit light and may be formed by using the above described hole transport compound (specifically, an aromatic amine-based compound) doped with a material having acceptor properties thereto in addition to a transparent conductive material such as ITO, IZO, or ZnO. Specifically, VOPc doped with 2,3,5,6-tetrafluoro-7,7,8,8-tetracyanoquinodimethane (abbreviated to F$_4$-TCNQ) which is an acceptor or α-NPD doped with MoO$_x$ which is an acceptor may be used for the second anode 121.

As a cathode (the first cathode 113 and the second cathode 123) material, a conductive material having a low work function is preferably used. Specifically, rare earth metal such as Yb or Er can be used to form the cathode, in addition to alkali metal such as Li or Cs, alkaline earth metal such as Mg, Ca, or Sr, or an alloy including the metal (Mg:Ag, Al:Li, or the like). In the case of using an electron injection layer of LiF, CsF, CaF$_2$, Li$_2$O, or the like, a typical conductive thin film of aluminum or the like can be used. In the case of extracting light through the second cathode 123, a laminated structure of an ultrathin film including alkali metal such as Li or Cs and alkaline earth metal such as Mg, Ca, or Sr and a transparent conductive film (ITO, IZO, ZnO, or the like) may be used. Alternatively, the above-described electron transport material may be doped with a material having donor properties thereto (alkali metal, alkaline earth metal, or the like), and a transparent conductive film (ITO, IZO, ZnO, or the like) may be laminated thereover. The first cathode 113 needs to transmit light, and the above-described electron transport material may be doped with a material having donor properties thereto (alkali metal, alkaline earth metal, or the like). Specifically, BCP doped with lithium which is a donor or Alq$_3$ doped with lithium which is a donor can be used.

Note that a method for laminating each layer of a light emitting element is not specifically limited in manufacturing the above-described light emitting element of the invention. Any method such as a vacuum evaporation method, a spin coating method, an ink-jet method, or a dip coating method can be selected as long as lamination can be performed.

Embodiment

Embodiments of the invention are described hereinafter.

Embodiment 1

Figure 5:
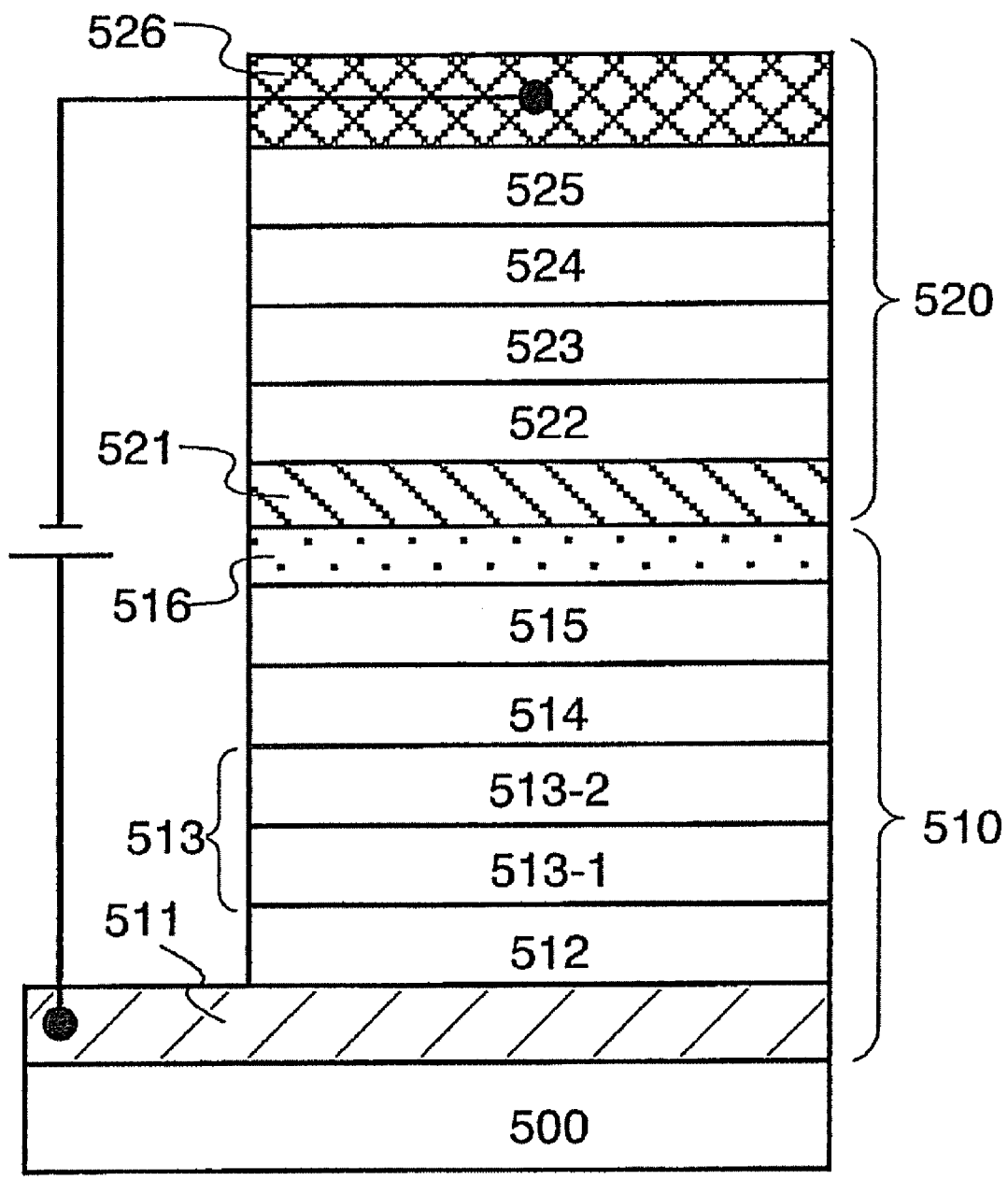
FIG. 5 shows a structure of a light emitting element of the present invention in Embodiment 1.

An element structure and a manufacturing method of a light emitting element of the invention are specifically described in this embodiment with reference to FIG. 5.

A glass substrate 500 provided with an indium tin oxide (ITO) film of 110 nm in thickness is prepared. The provided ITO film serves as a first anode 511 in this embodiment.

The glass substrate 500 provided with the first anode 511 is fixed to a substrate holder in a vacuum evaporation apparatus so that a surface provided with the first anode 511 faces downward. Then, a CuPc film is formed with a thickness of 20 nm over the first anode 511 by a vacuum evaporation method to form a hole injection layer 512. Vacuum evaporation is performed by putting CuPc in an evaporation source provided inside the vacuum evaporation apparatus and evaporating the CuPc by a resistance heating method. Note that the hole injection layer 512 also serves as a hole transport layer in this embodiment.

A light emitting layer 513 of a first light emitting element 510 is formed over the hole injection layer 512. In this embodiment, the light emitting layer 513 of the first light emitting element 510 includes a first light emitting layer 513-1 and a second light emitting layer 513-2. The first light emitting layer 513-1 is in contact with the second light emitting layer 513-2.

The first light emitting layer 513-1 includes α-NPD and perylene and is formed by a co-evaporation method using α-NPD and perylene as evaporation sources. At this time, an adjustment is performed so that perylene is included in α-NPD at a rate of 3 mass %. The thickness is to be 30 nm. In the first light emitting layer 513-1, perylene serves as a light emitting organic compound which emits blue to blue green light.

The second light emitting layer 513-2 includes DNA and DCM2 and is formed by a co-evaporation method using DNA and DCM2 as evaporation sources. At this time, an adjustment is performed so that DCM2 is included in DNA at a rate of 0.1 mass %. The thickness is to be 30 nm. In the second light emitting layer 513-2, DCM2 serves as a light emitting organic compound which emits yellow to orange light.

Subsequently, a BCP film is formed with a thickness of 10 nm over the light emitting layer 513 of the first light emitting element 510 to form an electron transport layer 514. Then, an Alq$_3$ film is formed with a thickness of 20 nm over the electron transport layer 514 to form an electron injection layer 515. These layers are also formed by a vacuum evaporation method as in the case of forming the hole injection layer 512.

Further, a first cathode 516 is formed over the electron injection layer 515. The first cathode 516 includes BCP, which is an electron transport compound, and lithium, which is a material giving donor properties to BCP, and is formed by a co-evaporation method using BCP and lithium as evaporation sources. At this time, an adjustment is performed so that lithium is included in BCP at a rate of 0.5 mass %. The thickness is to be 10 nm.

After the first light emitting element 510 is formed in this way, a second light emitting element 520 is laminated in series. A second anode 521 is formed by forming a MoO$_x$ film with a thickness of 10 nm. The second anode 521 is also formed by a vacuum evaporation method as in the case of forming the hole injection layer 512.

Subsequently, an α-NPD film is formed with a thickness of 50 nm over the second anode 521 to form a hole injection layer 522. Note that the hole injection layer 522 also serves as a hole transport layer in this embodiment. The hole injection layer 522 is also formed by a vacuum evaporation method as in the case of forming the hole injection layer 512.

A light emitting layer 523 of the second light emitting element is formed over the hole injection layer 522. The light emitting layer 523 of the second light emitting element includes CBP and Ir(btp)$_2$(acac), and is formed by a co-evaporation method using CBP and Ir(btp)$_2$(acac) as evaporation sources. At this time, an adjustment is performed so that Ir(btp)$_2$(acac) is included in CBP at a rate of 8 mass %. The thickness is to be 30 nm. In the light emitting layer 523 of the second light emitting element, Ir(btp)$_2$(acac) serves as a light emitting organic compound which emits light of a different color from that of the first light emitting element.

A BCP film is formed with a thickness of 10 nm over the light emitting layer 523 of the second light emitting element to form an electron transport layer 524. An Alq$_3$ film is formed with a thickness of 20 nm over the electron transport layer 524 to form an electron injection layer 525. These layers are also formed by a vacuum evaporation method as in the case of forming the hole injection layer 512.

A second cathode 526 is formed over the electron injection layer 525. The second cathode 526 includes BCP, which is an electron transport compound, and lithium, which is a material giving donor properties to BCP, and is formed by a co-evaporation method using BCP and lithium as evaporation sources. At this time, an adjustment is performed so that lithium is included in BCP at a rate of 0.5 mass %. The thickness is to be 10 nm. The second cathode 526 is formed by further evaporating Al with a thickness of 150 nm.

Since the first light emitting element 510 which is formed as described above has the first light emitting layer which emits blue to blue green light and the second light emitting layer which emits yellow to orange light, it shows an emission spectrum having two peaks in a blue to blue green wavelength range and in a yellow to orange wavelength range. Since the second light emitting element 520 emits red light, it shows an emission spectrum having a peak in a different position from those of the first light emitting element.

Therefore, the light emitting element of this embodiment, in which the first light emitting element 510 and the second light emitting element 520 are laminated in series, can provide broad white light which widely covers a blue to blue green wavelength range, a yellow to orange wavelength range, and a red wavelength range by applying voltage between the first anode 511 and the second cathode 526. Even when luminance of any light of three colors is deteriorated over time or changed depending on current density, a shift in chromaticity is relatively small due to the effect of the broad spectrum.

Embodiment 2

Figure 6:
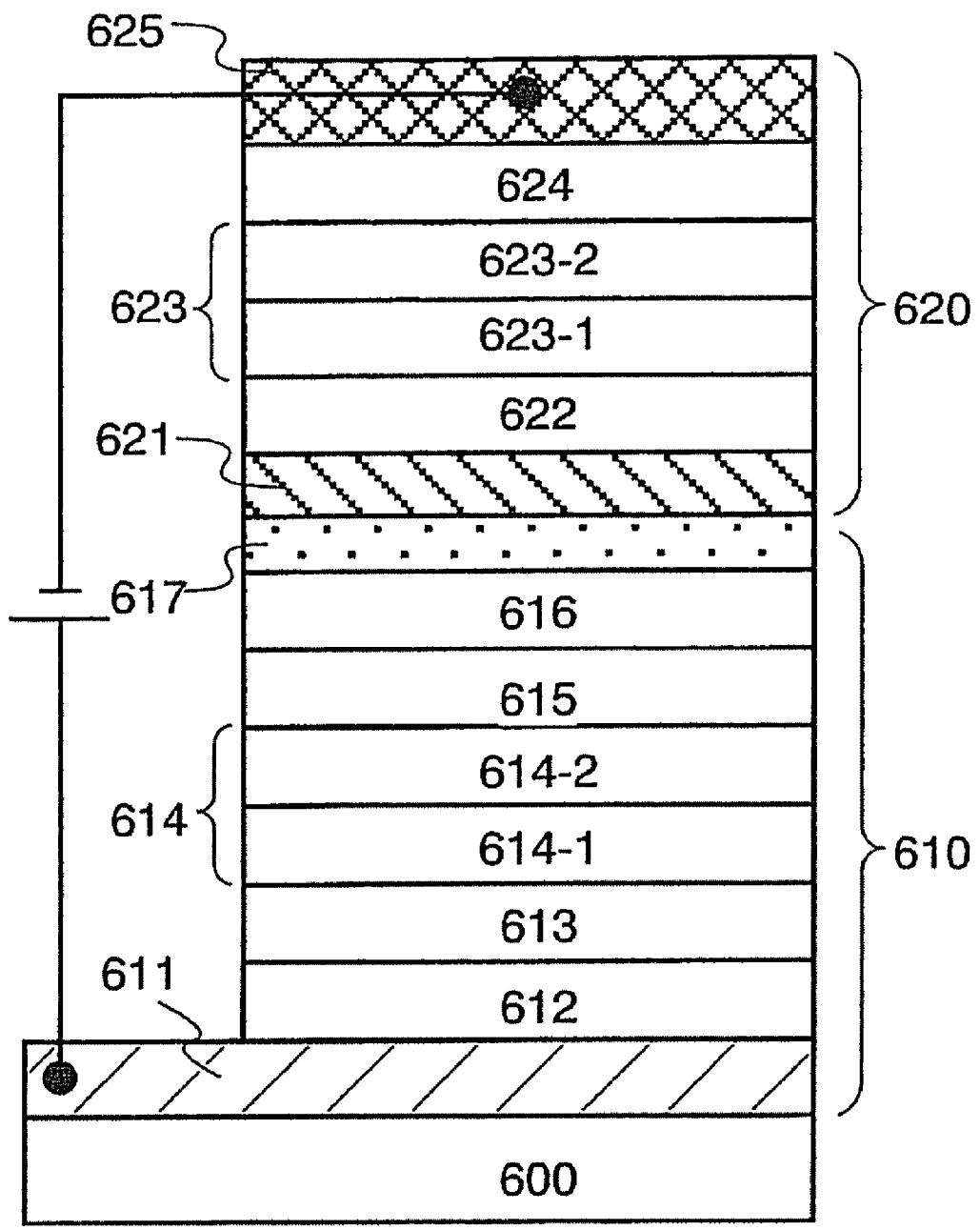
FIG. 6 shows a structure of a light emitting element of the present invention in Embodiment 2.

An element structure and a manufacturing method of a light emitting element of the invention are specifically described in this embodiment with reference to FIG. 6.

A glass substrate 600 provided with an indium tin oxide (ITO) film of 110 nm in thickness is prepared. The provided ITO film serves as a first anode 611 in this embodiment.

The glass substrate 600 provided with the first anode 611 is fixed to a substrate holder in a vacuum evaporation apparatus so that a surface provided with the first anode 611 faces downward. Then, a DNTPD film is formed with a thickness of 20 nm over the first anode 611 by a vacuum evaporation method to form a hole injection layer 612. Vacuum evaporation is performed by putting DNTPD in an evaporation source provided inside the vacuum evaporation apparatus and evaporating the DNTPD by a resistance heating method.

Subsequently, an α-NPD film is formed with a thickness of 20 nm over the hole injection layer 612 to form a hole transport layer 613. The hole transport layer 613 is also formed by a vacuum evaporation method as in the case of forming the hole injection layer 612.

A light emitting layer 614 of a first light emitting element is formed over the hole transport layer 613. In this embodiment, the light emitting layer 614 of the first light emitting element includes a first light emitting layer 614-1 and a second light emitting layer 614-2. The first light emitting layer 614-1 is in contact with the second light emitting layer 614-2.

The first light emitting layer 614-1 includes α-NPD and TBP and is formed by a co-evaporation method using α-NPD and TBP as evaporation sources. At this time, an adjustment is performed so that TBP is included in α-NPD at a rate of 1 mass %. The thickness is to be 10 nm. In the first light emitting layer 614-1, TBP serves as a light emitting organic compound which emits blue to blue green light.

The second light emitting layer 614-2 includes α-NPD and DCM2 and is formed by a co-evaporation method using α-NPD and DCM2 as evaporation sources. At this time, an adjustment is performed so that DCM2 is included in α-NPD at a rate of 1 mass %. The thickness is to be 10 nm. In the second light emitting layer 614-2, DCM2 serves as a light emitting organic compound which emits yellow to orange light.

Subsequently, a BAlq film is formed with a thickness of 20 nm over the light emitting layer 614 of the first light emitting element to form an electron transport layer 615. Then, an Alq$_3$ film is formed with a thickness of 30 nm over the electron transport layer 615 to form an electron injection layer 616. These layers are also formed by a vacuum evaporation method as in the case of forming the hole injection layer 612.

Further, a first cathode 617 is formed over the electron injection layer 616. The first cathode 617 includes BCP, which is an electron transport compound, and lithium, which is a material giving donor properties to BCP, and is formed by a co-evaporation method using BCP and lithium as evaporation sources. At this time, an adjustment is performed so that lithium is included in BCP at a rate of 0.5 mass %. The thickness is to be 10 nm.

After the first light emitting element 610 is formed in this way, a second light emitting element 620 is laminated in series. A second anode 621 includes α-NPD, which is a hole transport compound, and MoO$_x$, which is a material giving acceptor properties to α-NPD, and is formed by a co-evaporation method using α-NPD and MoO$_x$ as evaporation sources. At this time, an adjustment is performed so that MoO$_x$ is included in α-NPD at a rate of 25 mass %. The thickness is to be 50 nm.

Subsequently, an α-NPD film is formed with a thickness of 25 nm over the second anode 621 to form a hole injection layer 622. The hole injection layer 622 is also formed by a vacuum evaporation method as in the case of forming the hole injection layer 612. Note that the hole injection layer 622 also serves as a hole transport layer in this embodiment.

A light emitting layer 623 of the second light emitting element is formed over the hole injection layer 622. In this embodiment, the light emitting layer 623 of the second light emitting element includes a third light emitting layer 623-1 and a fourth light emitting layer 623-2. The third light emitting layer 623-1 is in contact with the fourth light emitting layer 623-2.

The third light emitting layer 623-1 includes α-NPD and BisDCM, and is formed by a co-evaporation method using α-NPD and BisDCM as evaporation sources. At this time, an adjustment is performed so that BisDCM is included in α-NPD at a rate of 2 mass %. The thickness is to be 15 nm. In the third light emitting layer 623-1, BisDCM serves as a light emitting organic compound which emits orange to red (specifically, red) light.

The fourth light emitting layer 623-2 is formed by forming a Ga(mq)$_2$Cl film to be 20 nm in thickness. The fourth light emitting layer 623-2 is formed by a vacuum evaporation method as in the case of forming the hole injection layer 622. In the fourth light emitting layer 623-2, Ga(mq)$_2$Cl serves as a light emitting organic compound which emits blue green to green (specifically, emerald green) light.

An Alq$_3$ film is formed with a thickness of 55 nm over the light emitting layer 623 of the second light emitting element to form an electron injection layer 624. The electron injection layer 624 is also formed by a vacuum evaporation method as in the case of forming the hole injection layer 612. Note that the electron injection layer 624 also serves as an electron transport layer in this embodiment.

A second cathode 625 is formed over the electron injection layer 624. The second cathode 625 includes BCP, which is an electron transport compound, and lithium, which is a material having donor properties to BCP, and is formed by a co-evaporation method using BCP and lithium as evaporation sources. At this time, an adjustment is performed so that lithium is included in BCP at a rate of 0.5 mass %. The thickness is to be 10 nm. The second cathode 625 is formed by further evaporating Al with a thickness of 150 nm.

Since the first light emitting element 610 which is formed as described above has the first light emitting layer which emits blue to blue green light and the second light emitting layer which emits yellow to orange light, it shows an emission spectrum having two peaks in a blue to blue green wavelength range and in a yellow to orange wavelength range. Since the second light emitting element 620 has the third light emitting layer which emits blue green to green light and the fourth light emitting layer which emits orange to red light, it shows an emission spectrum having two peaks in a blue green to green wavelength range and in an orange to red wavelength range.

Therefore, the light emitting element of this embodiment, in which the first light emitting element 610 and the second light emitting element 620 are laminated in series, can provide broad white light which covers a blue to blue green wavelength range, a yellow to orange wavelength range, a blue green to green wavelength range, and an orange to red wavelength range, that is, an almost entire visible light range by applying voltage between the first anode 611 and the second cathode 625. Specifically, a great advantage is that sufficient luminance can be achieved in emerald green and red wavelength ranges where sufficient luminance cannot be obtained with white color using only the first light emitting element. Even when luminance of any light of four colors is deteriorated over time or changed depending on current density, a shift in chromaticity is relatively small due to the effect of the broad spectrum.

Embodiment 3

Figure 7A:
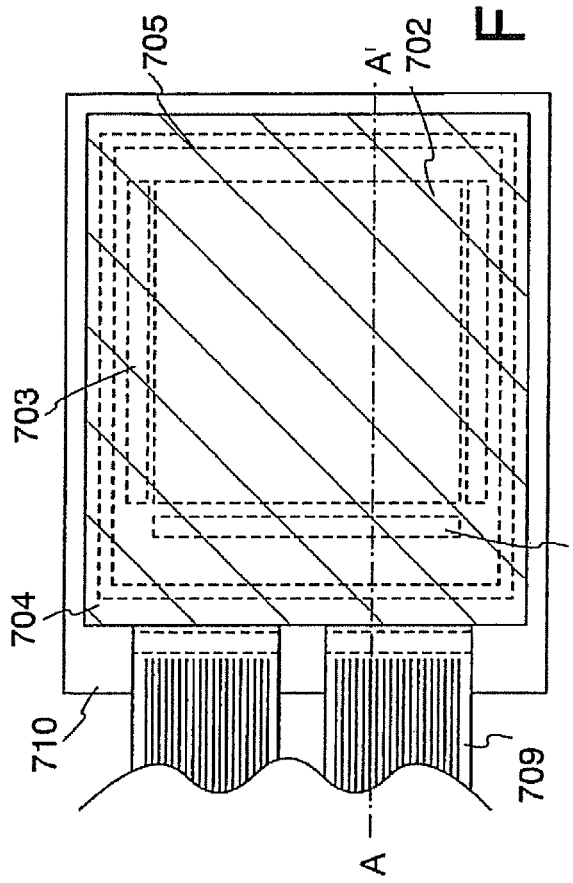
FIGS. 7A and 7B show a structure of a light emitting device using a light emitting element of the present invention.
Figure 7B:
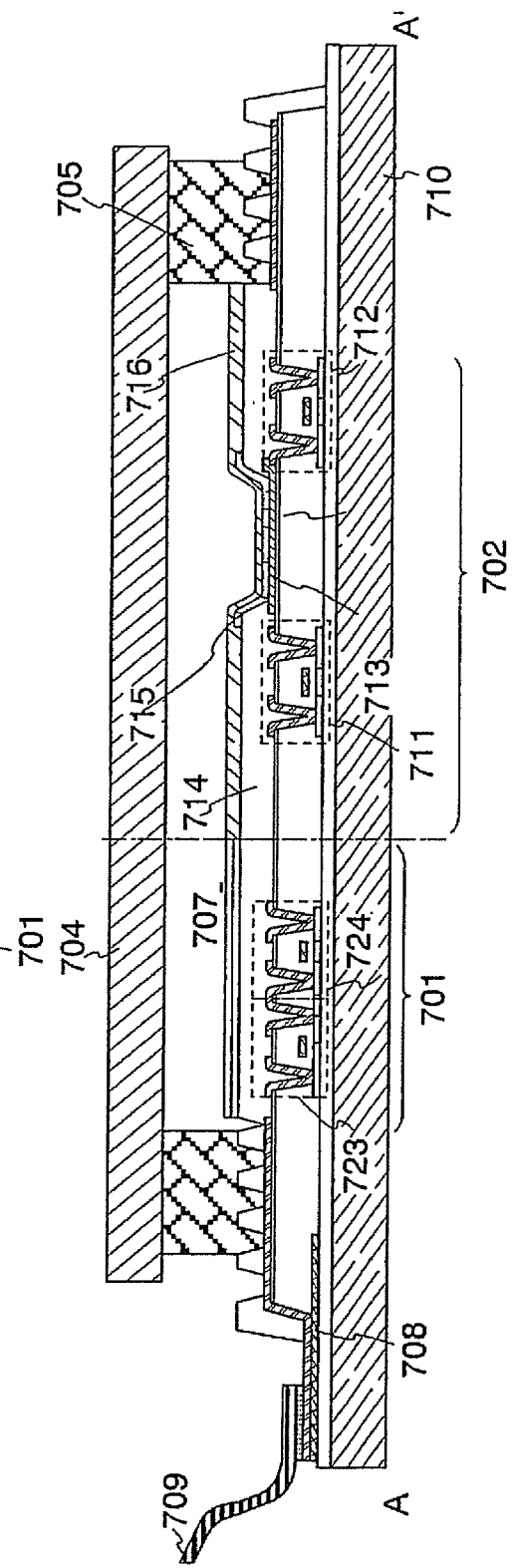

A light emitting device having a light emitting element of the invention is described in this embodiment with reference to FIGS. 7A and 7B. Note that FIG. 7A is a top view showing a light emitting device and FIG. 7B is a cross-sectional view of FIG. 7A taken along line A-A'. Reference numeral 701 shown by dashed line denotes a driver circuit portion (a source side driver circuit); 702, a pixel portion; and 703, a driver circuit portion (a gate side driver circuit). Reference numeral 704 denotes a sealing substrate; 705, a sealant; and 707, a space surrounded by the sealant 705.

Reference numeral 708 denotes a wiring for transmitting a signal to be input to the source side driver circuit 701 and the gate side driver circuit 703 and receives a video signal, a clock signal, a start signal, a reset signal, or the like from an FPC (flexible printed circuit) 709 that is an external input terminal. Note that only the FPC is shown here; however, the FPC may be provided with a printed wiring board (PWB). The light emitting device in this specification includes not only a light emitting device itself but also a light emitting device with an FPC or a PWB attached.

Subsequently, a cross-sectional structure is described with reference to FIG. 7B. A driver circuit portion and a pixel portion are formed over an element substrate 710. Here, a source side driver circuit 701 which is a driver circuit portion and a pixel portion 702 are shown.

Note that a CMOS circuit which is a combination of an n-channel TFT 723 and a p-channel TFT 724 is formed as the source side driver circuit 701. A circuit forming the driver circuit may be formed using a known CMOS circuit, PMOS circuit, or NMOS circuit. A driver integrated type in which a driver circuit is formed over the sane substrate is described in this embodiment, but not exclusively, a driver circuit can be formed outside the substrate.

The pixel portion 702 has a plurality of pixels each including a switching TFT 711, a current control TFT 712, and an anode 713 which is electrically connected to the drain region of the current control TFT 712. Note that an insulator 714 is formed to cover an end of the anode 713. Here, a positive type photosensitive acrylic resin film is used for the insulator 714.

The insulator 714 is formed to have a curved surface at an upper end or a lower end thereof in order to increase the coverage of a film to be formed. For example, in the case of using positive type photosensitive acrylic as a material of the insulator 714, the insulator 714 is preferably formed to have a curved surface with a curvature radius (0.2 µm to 3 µm) only at an upper end. Either a negative type which becomes insoluble in an etchant by light or a positive type which becomes soluble in an etchant by light can be used as the insulator 714. Not only an organic compound but also an inorganic compound such as silicon oxide or silicon oxynitride can be used.

A light emitting element 715 and a cathode 716 are formed over the anode 713. Here, a material having a high work function is preferably used as a material of the anode 713. For example, the anode 713 can be formed by using a single-layer film such as an ITO (indium tin oxide) film, an ITSO (indium tin silicon oxide) film, an IZO (indium zinc oxide) film, a titanium nitride film, a chromium film, a tungsten film, a Zn film, or a Pt film; a laminated layer of a titanium nitride film and a film containing aluminum as its main component; or a three-layer structure of a titanium nitride film, a film containing aluminum as its main component, and another titanium nitride film. When the anode 713 is formed of an ITO film and a wiring of the current control TFT 712 connected to the anode 713 has a laminated structure of a titanium nitride film and a film containing aluminum as its main component or a laminated structure of a titanium nitride film, a film containing aluminum as its main component, and another titanium nitride film, the wiring can have low resistance as a wiring and a favorable ohmic contact with the ITO film. Further, the anode 713 can be made to serve as an anode. The anode 713 may be formed of the same material as that of the first anode in the light emitting element 715 of the invention. Alternatively, the anode 713 may be integrated with the first anode of the light emitting element 715.

The light emitting element 715 of the invention has a laminated structure of the first light emitting element 110 and the second light emitting element 120 as shown in FIGS. 1A and 1B. Specifically, the light emitting element 715 has a similar structure to those of Embodiment Modes, Embodiment 1, and Embodiment 2.

The cathode 716 may be formed of a material having a low work function (Al, Ag, Li, Ca, or an alloy thereof such as MgAg, MgIn, AlLi, $CaF_2$, or CaN); however, there is no particular limitation thereto. Various conductive films can be applied by selecting an appropriate electron injection material. In the case where light emitted from the light emitting element 715 of the invention is transmitted through the cathode 716, it is conceivable that the cathode 716 is formed by laminating a metal thin film with thin thickness and a transparent conductive film of ITO (indium tin oxide), ITSO (indium tin silicon oxide), indium oxide-zinc oxide ($In_2O_3$—ZnO), zinc oxide (ZnO), or the like. The cathode 716 may be formed of the same material as that of the second cathode in the light emitting element 715 of the invention. Alternatively, the cathode 716 may be integrated with the second cathode of the light emitting element 715.

By attaching the sealing substrate 704 to the element substrate 710 with the sealant 705, the light emitting element 715 is provided in the space 707 surrounded by the element substrate 710, the sealing substrate 704, and the sealant 705. Note that the space 707 may be filled with the sealant 705 as well as an inert gas (nitrogen, argon, or the like).

Note that an epoxy-based resin is preferably used as the sealant 705. The material preferably allows as little moisture and oxygen as possible to penetrate. As the sealing substrate 704, a plastic substrate formed of FRP (Fiberglass-Reinforced Plastics), PVF (polyvinyl fluoride), Myler, polyester, acrylic, or the like can be used besides a glass substrate or a quartz substrate.

As described above, a light emitting device having a light emitting element of the invention can be provided.

Note that the light emitting device described in this embodiment can be freely combined with the structure of the light emitting elements described in Embodiment Modes, Embodiment 1, and Embodiment 2. Further, a chromaticity conversion film such as a color filter may be used, if necessary, in the light emitting device described in this embodiment.

Embodiment 4

Various electronic devices completed by using a light emitting element of the invention are described in this embodiment with reference to FIGS. 8A to 8E.

Examples of electronic devices, which are manufactured using light emitting devices having the light emitting elements of the invention, can be given as follows: a television set, a camera such as a video camera or a digital camera, a goggle type display (head mounted display), a navigation system, an audio reproducing device (a car audio, an audio component, or the like), a personal computer, a game machine, a personal digital assistant (a mobile computer, a cellular phone, a portable game machine, an electronic book, or the like), an image reproducing device including a recording medium (specifically, a device capable of reproducing a recording medium such as a Digital Versatile Disc (DVD) and having a display that can display the image), a lighting device, and the like. Practical examples of these electric devices are shown in FIGS. 8A to 8E.

Figure 8A:
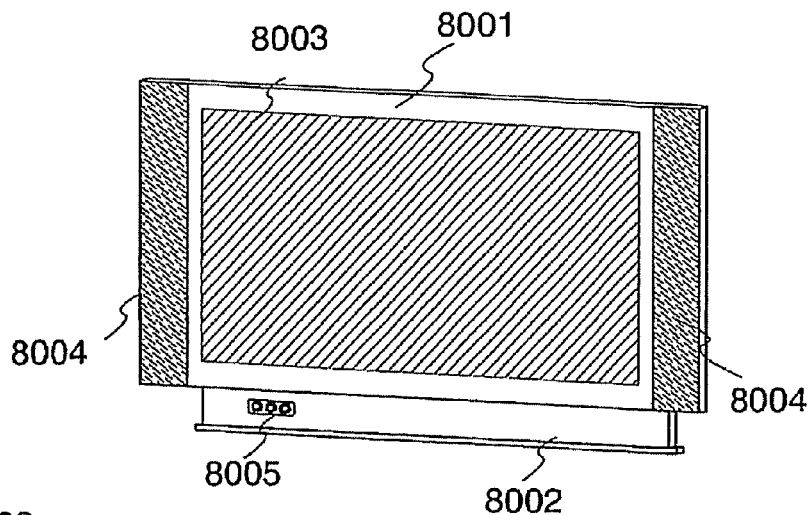
FIGS. 8A to 8E show examples of an electric device using a light emitting device of the present invention.

FIG. 8A shows a display device, which includes a chassis 8001, a supporting section 8002, a display portion 8003, a speaker portion 8004, a video input terminal 8005, and the like. The display device is manufactured by using the light emitting device formed according to the invention as the display portion 8003. The display device includes all display devices for displaying information, including ones for personal computers, for TV broadcasting reception, for advertisement, and so on.

Figure 8B:
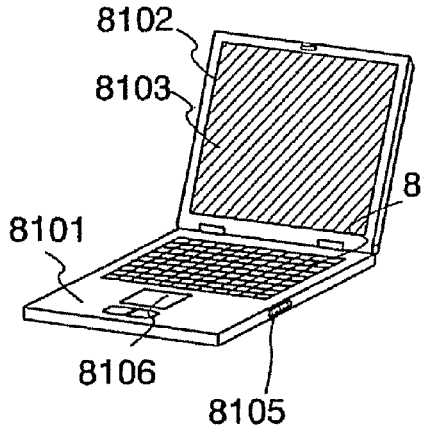

FIG. 8B shows a portable personal computer, which includes a main body 8101, a chassis 8102, a display portion 8103, a keyboard 8104, an external connection port 8105, a pointing mouse 8106, and the like. The portable personal computer is manufactured by using the light emitting device having the light emitting element of the invention as the display portion 8103.

Figure 8C:
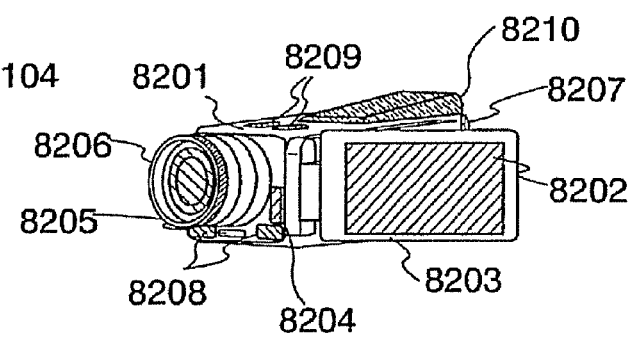

FIG. 8C shows a video camera, which includes a main body 8201, a display portion 8202, a chassis 8203, an external connection port 8204, a remote control receiving portion 8205, an image receiving portion 8206, a battery 8207, an audio input portion 8208, an operation key 8209, an eye piece portion 8210, and the like. The video camera is manufactured by using the light emitting device having the light emitting element of the invention as the display portion 8202.

Figure 8D:
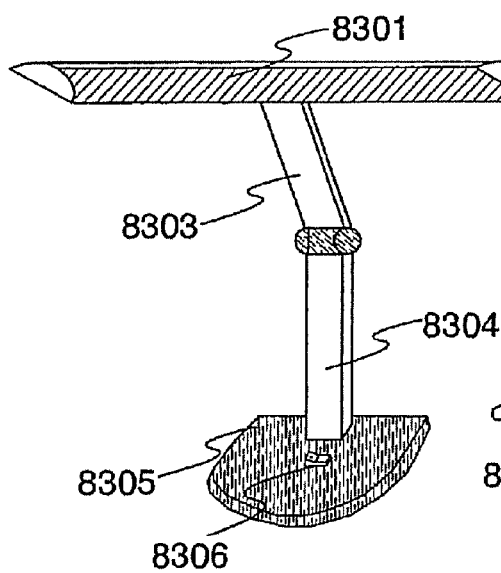

FIG. 8D shows a desk lighting device, which includes a lighting portion 8301, a shade 8302, a variable arm 8303, a support post 8304, a base 8305, and a power supply switch 8306. The desk lighting device is manufactured by using the light emitting device formed using the light emitting element of the invention as the lighting portion 8301. Note that the lighting device includes a ceiling-fixed lighting device, a wall-mounted lighting device, and the like.

Figure 8E:
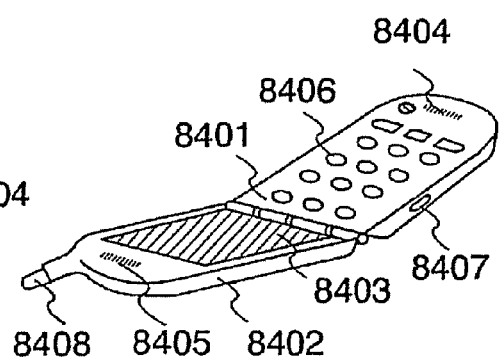

FIG. 8E shows a cellular phone, which includes a main body 8401, a chassis 8402, a display portion 8403, an audio input portion 8404, an audio output portion 8405, an operation key 8406, an external connection port 8407, an antenna 8408, and the like. The cellular phone is manufactured by using the light emitting device having the light emitting element of the invention as the display portion 8403.

As described above, an electronic device or a lighting device using the light emitting element of the invention can be provided. An application range of the light emitting device having the light emitting element of the invention is extremely wide, and the light emitting device can be applied to electronic devices in all fields.

The invention claimed is:

1. A light emitting device comprising:
   a thin film transistor over a substrate, the thin film transistor comprising:
      a semiconductor film over the substrate;
      an insulating film adjacent to the semiconductor film; and
      a gate electrode adjacent to the semiconductor film with the insulating film interposed therebetween;
   a first light emitting element having a first light emitting layer including a light emitting organic compound between a first anode and a first cathode;
   a second light emitting element having a second light emitting layer including a light emitting organic compound between a second anode and a second cathode; and
   a color filter,
   wherein the first light emitting element and the second light emitting element are connected in series and are electrically connected to the thin film transistor,
   wherein the first light emitting element shows a first emission spectrum having at least two peaks and the second light emitting element shows a second emission spectrum having a peak in a different position from positions of the two peaks,
   wherein a white emission color is shown by the first emission spectrum and the second emission spectrum, and
   wherein the color filter is arranged to change a chromaticity of the white emission color.

2. The light emitting device according to claim 1, wherein the second emission spectrum has at least two peaks.

3. A light emitting device comprising:
   a thin film transistor over a substrate, the thin film transistor comprising:
      a semiconductor film over the substrate;
      an insulating film adjacent to the semiconductor film; and
      a gate electrode adjacent to the semiconductor film with the insulating film interposed therebetween;
   a first light emitting element having a first light emitting layer including a light emitting organic compound between a first anode and a first cathode;
   a second light emitting element having a second light emitting layer including a light emitting organic compound between a second anode and a second cathode; and
   a color filter,
   wherein the first light emitting element and the second light emitting element are connected in series and are electrically connected to the thin film transistor,
   wherein the first light emitting element shows a first emission color including two kinds of emission colors having a complementary color relationship and the second light emitting element shows a second emission color different from the two kinds of emission colors,
   wherein a white emission color is shown by the first emission color and the second emission color, and
   wherein the color filter is arranged to change a chromaticity of the white emission color.

4. The light emitting device according to claim 3, wherein the second emission color includes two kinds of emission colors having a complementary color relationship, and the two kinds of emission colors of the second emission color are different from the two kinds of emission colors of the first emission color.

5. A light emitting device comprising:
   a thin film transistor over a substrate, the thin film transistor comprising:
      a semiconductor film over the substrate;
      an insulating film adjacent to the semiconductor film; and
      a gate electrode adjacent to the semiconductor film with the insulating film interposed therebetween;
   a first light emitting element having a first light emitting layer including a light emitting organic compound between a first anode and a first cathode; and
   a second light emitting element having a second light emitting layer including a light emitting organic compound between a second anode and a second cathode; and
   a color filter,
   wherein the first light emitting element and the second light emitting element are connected in series and are electrically connected to the thin film transistor,
   wherein the first light emitting element shows a first emission spectrum having peaks in a blue to blue green wavelength range and in a yellow to orange wavelength range and the second light emitting element shows a second emission spectrum having a peak in a different position from positions of the peaks,
   wherein a white emission color is shown by the first emission spectrum and the second emission spectrum, and
   wherein the color filter is arranged to change a chromaticity of the white emission color.

6. The light emitting device according to claim 5, wherein the second emission spectrum is an emission spectrum having peaks in a blue green to green wavelength range and in an orange to red wavelength range.

7. A light emitting device comprising:
   a thin film transistor over a substrate, the thin film transistor comprising:
      a semiconductor film over the substrate;
      an insulating film adjacent to the semiconductor film; and
      a gate electrode adjacent to the semiconductor film with the insulating film interposed therebetween;
   a first light emitting element having a first light emitting layer including a light emitting organic compound between a first anode and a first cathode;
   a second light emitting element having a second light emitting layer including a light emitting organic compound between a second anode and a second cathode; and
   a color filter, wherein the first light emitting element and the second light emitting element are connected in series and are electrically connected to the thin film transistor, wherein the first light emitting element shows a first emission spectrum having peaks in a wavelength range from 430 nm to 480 nm and in a wavelength range from 550 nm to 600 nm and the second light emitting element shows a second emission spectrum having a peak in a different position from positions of the peaks, wherein a white emission color is shown by the first emission spectrum and the second emission spectrum, and wherein the color filter is arranged to change a chromaticity of the white emission color.

8. The light emitting device according to claim 7, wherein the second emission spectrum is an emission spectrum having peaks in a wavelength range from 480 nm to 550 nm and in a wavelength range from 600 nm to 680 nm.

9. The light emitting device according to any one of claims 1, 3, 5 and 7, wherein the first light emitting layer comprises a third light emitting layer and a fourth light emitting layer which shows a different emission color from an emission color of the third light emitting layer.

10. The light emitting device according to claim 9, wherein the third light emitting layer is in contact with the fourth light emitting layer.

11. The light emitting device according to any one of claims 1, 3, 5 and 7, wherein the second light emitting layer comprises a fifth light emitting layer and a sixth light emitting layer which shows a different emission color from an emission color of the fifth light emitting layer.

12. The light emitting device according to claim 11, wherein the fifth light emitting layer is in contact with the sixth light emitting layer.

13. The light emitting device according to any one of claims 1, 3, 5 and 7,
wherein the second anode comprises an hole transporting compound and $MoO_x$.

14. The light emitting device according to any one of claims 1, 3, 5 and 7,
wherein the second anode comprises an aromatic amine-based compound and $MoO_x$.

15. The light emitting device according to any one of claims 1, 3, 5 and 7,
wherein the first cathode comprises an electron transporting material and a material having donor properties to the electron transporting material.

16. The light emitting device according to any one of claims 1, 3, 5 and 7,
wherein the first cathode comprises an electron transporting material and a material having donor properties to the electron transporting material, and
wherein the material having donor properties is selected from alkali metals and alkaline earth metals.

17. A lighting device comprising:
a first light emitting element having a first light emitting layer including a light emitting organic compound; and
a second light emitting element having a second light emitting layer including a light emitting organic compound,
wherein the first light emitting element and the second light emitting element are connected in series,
wherein the first light emitting layer and the second light emitting layer are overlapped with each other, and
wherein the first light emitting layer comprises a third light emitting layer and a fourth light emitting layer which shows a different emission color from an emission color of the third light emitting layer.

18. The lighting device according to claim 17, wherein the third light emitting layer is in contact with the fourth light emitting layer.

19. The lighting device according to claim 17, wherein the second light emitting layer comprises a fifth light emitting layer and a sixth light emitting layer which shows a different emission color from an emission color of the fifth light emitting layer.

20. The lighting device according to claim 19, wherein the fifth light emitting layer is in contact with the sixth light emitting layer.

21. A lighting device comprising:
a first light emitting element having a first light emitting layer including a light emitting organic compound; and
a second light emitting element having a second light emitting layer including a light emitting organic compound,
wherein the first light emitting element and the second light emitting element are connected in series,
wherein the first light emitting layer and the second light emitting layer are overlapped with each other, and
wherein the second light emitting layer comprises a fifth light emitting layer and a sixth light emitting layer which shows a different emission color from an emission color of the fifth light emitting layer.

22. The lighting device according to claim 21, wherein the fifth light emitting layer is in contact with the sixth light emitting layer.

23. The lighting device according to claim 17 or 21, wherein the lighting device further comprises a color filter.

24. The lighting device according to claim 17 or 21,
wherein the second anode comprises an hole transporting compound and $MoO_x$.

25. The lighting device according to claim 17 or 21,
wherein the second anode comprises an aromatic amine-based compound and $MoO_x$.

26. The lighting device according to claim 17 or 21,
wherein the first cathode comprises an electron transporting material and a material having donor properties to the electron transporting material.

27. The lighting device according to claim 17 or 21,
wherein the first cathode comprises an electron transporting material and a material having donor properties to the electron transporting material, and
wherein the material having donor properties is selected from alkali metals and alkaline earth metals.

28. The lighting device according to claim 17 or 21,
wherein the lighting device shows a white emission color.

29. The lighting device according to claim 17 or 21,
wherein the first light emitting element shows a first emission spectrum having at least two peaks and the second light emitting element shows a second emission spectrum having a peak in a different position from positions of the two peaks.

30. The light emitting device according to any one of claims 1, 3, 5 and 7,
wherein the first cathode comprises a hole transport compound doped with a material having acceptor properties.

31. The light emitting device according to any one of claims 1, 3, 5 and 7,
wherein the second anode comprises a electron transport material doped with a material having donor properties.

32. The lighting device according to claim 17 or 21,
wherein the first cathode comprises a hole transport compound doped with a material having acceptor properties.

33. The lighting device according to claim 17 or 21,
wherein the second anode comprises a electron transport material doped with a material having donor properties.

* * * * *

UNITED STATES PATENT AND TRADEMARK OFFICE
CERTIFICATE OF CORRECTION

PATENT NO. : 8,076,671 B2
APPLICATION NO. : 12/705355
DATED : December 13, 2011
INVENTOR(S) : Shunpei Yamazaki and Satoshi Seo It is certified that error appears in the above-identified patent and that said Letters Patent is hereby corrected as shown below:

In The Specification:

Column 9, Line 62; Change "emitting The" to --emitting layer 312 between a first anode 311 and a first cathode 313. The--.

Column 12, Line 60; Change "alight" to --a light--.

Signed and Sealed this
Thirty-first Day of January, 2012

David J. Kappos
*Director of the United States Patent and Trademark Office*